US009691908B2

United States Patent
Hisada et al.

(10) Patent No.: US 9,691,908 B2
(45) Date of Patent: Jun. 27, 2017

(54) VERTICAL-CHANNEL TYPE JUNCTION SIC POWER FET AND METHOD OF MANUFACTURING SAME

(71) Applicant: RENESAS ELECTRONICS CORPORATION, Tokyo (JP)

(72) Inventors: Kenichi Hisada, Tokyo (JP); Koichi Arai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/870,922

(22) Filed: Sep. 30, 2015

(65) Prior Publication Data

US 2016/0035904 A1 Feb. 4, 2016

Related U.S. Application Data

(63) Continuation of application No. 14/270,469, filed on May 6, 2014, now Pat. No. 9,184,238.

(30) Foreign Application Priority Data

May 27, 2013 (JP) ................................ 2013-110780

(51) Int. Cl.
*H01L 29/808* (2006.01)
*H01L 29/16* (2006.01)
(Continued)

(52) U.S. Cl.
CPC ........ *H01L 29/8083* (2013.01); *H01L 27/098* (2013.01); *H01L 29/0692* (2013.01);
(Continued)

(58) Field of Classification Search
CPC ........... H01L 29/1608; H01L 29/66909; H01L 29/8083
(Continued)

(56) References Cited

U.S. PATENT DOCUMENTS 6,847,091 B2 1/2005 Deboy et al.
7,709,862 B2 5/2010 Nonaka et al.
(Continued)

FOREIGN PATENT DOCUMENTS

CN 102916049 B 4/2015
JP 55-68678 A 5/1980
(Continued)

OTHER PUBLICATIONS

Japanese Office Action received in corresponding Japanese Application No. 2013-110780 dated Nov. 17, 2016.

*Primary Examiner* — Fernando L Toledo
*Assistant Examiner* — Adam S Bowen
(74) *Attorney, Agent, or Firm* — Mattingly & Malur, PC

(57) ABSTRACT

In order to secure the performance of a SiC-based JFET having an impurity diffusion rate lower than silicon-based one, a gate depth is secured while precisely controlling a distance between gate regions, instead of forming gate regions by ion implantation into the side wall of a trench. This means that a channel region defined by a gate distance and a gate depth should have a high aspect ratio. Further, due to limitations of process, a gate region is formed within a source region. Formation of a highly doped PN junction between source and gate regions causes various problems such as inevitable increase in junction current. In addition, a markedly high energy ion implantation becomes necessary for the formation of a termination structure. In the invention, provided is a vertical channel type SiC power JFET having a floating gate region below and separated from a source region and between gate regions.

8 Claims, 36 Drawing Sheets

(51) Int. Cl.
*H01L 29/66* (2006.01)
*H01L 29/06* (2006.01)
*H01L 29/10* (2006.01)
*H01L 27/098* (2006.01)

(52) U.S. Cl.
CPC ...... *H01L 29/1066* (2013.01); *H01L 29/1095* (2013.01); *H01L 29/1608* (2013.01); *H01L 29/66037* (2013.01)

(58) Field of Classification Search
USPC ......................................................... 257/77
See application file for complete search history.

(56) References Cited

U.S. PATENT DOCUMENTS

| | | |
|---|---|---|
| 2002/0167011 A1 | 11/2002 | Kumar et al. |
| 2005/0006649 A1 | 1/2005 | Iwasaki et al. |
| 2010/0148244 A1* | 6/2010 | Kitabatake .............. H01L 24/06 257/328 |
| 2011/0193101 A1 | 8/2011 | Yanase et al. |
| 2014/0117415 A1* | 5/2014 | Ma ...................... H01L 27/0617 257/262 |

FOREIGN PATENT DOCUMENTS

| | | |
|---|---|---|
| JP | 56-70669 A | 6/1981 |
| JP | 2002-520816 A | 7/2002 |
| JP | 2003-31591 A | 1/2003 |
| JP | 2007-42803 A | 2/2007 |
| JP | 2007-88342 A | 4/2007 |
| WO | 00/14809 A1 | 3/2000 |

* cited by examiner

VERTICAL-CHANNEL TYPE JUNCTION SIC POWER FET AND METHOD OF MANUFACTURING SAME

CROSS-REFERENCE TO RELATED APPLICATIONS

The disclosure of Japanese Patent Application No. 2013-110780 filed on May 27, 2013 including the specification, drawings, and abstract is incorporated herein by reference in its entirety.

BACKGROUND

The present application relates to a junction type power FET (or semiconductor device) and a method of manufacturing the same, for example, those applicable to a junction type SiC power FET.

Japanese Unexamined Patent Application Publication (Translation of PCT application) No. 2002-520816 (Patent Document 1) or U.S. Pat. No. 6,847,091 (Patent Document 2) corresponding thereto mainly relates to a planar type vertical power MOSFET. They show, with regard to a planar type vertical power MOSFET, a device structure having, in a drift region, floating regions of a conductivity type opposite to that of the drift region in a dispersed form. According to these documents, this power MOSFET is applicable to a junction FET or the like.

Japanese Patent Application Laid-Open No. 2003-31591 (Patent Document 3) or U.S. Patent Application Publication No. 2002-167011 (Patent Document 4) corresponding thereto relates to a vertical non-planar type junction FET. These documents disclose a vertical type junction FET having a lateral channel and having, in a drift region, a source potential region having a conductivity type opposite to that of the drift region.

WO 2000/014809 (Patent Document 5) or U.S. Patent Application Publication No. 2005-6649 (Patent Document 6) corresponding thereto relates to a vertical planar type junction FET. These documents disclose a vertical planar type junction FET having a floating P type region below a lateral channel thereof.

[Patent Document 1] Japanese Unexamined Patent Application Publication (Translation of PCT application) No. 2002-520816
[Patent Document 2] U.S. Pat. No. 6,847,091
[Patent Document 3] Japanese Patent Application Laid-Open No. 2003-31591
[Patent Document 4] U.S. Patent Application Publication No. 2002-167011
[Patent Document 5] WO 2000/014809
[Patent Document 6] U.S. Patent Application Publication No. 2005-6649

SUMMARY

In a SiC-based JFET (junction FET) having a markedly low impurity diffusion rate compared with a silicon-based JFET or the like, a gate region is generally formed by forming a trench in a gate formation region and then conducting ion implantation into the side wall of the trench. In order to secure the performance of the JFET, it is necessary to secure a gate depth while controlling the distance between gate regions with high precision. This means that a channel region defined by a gate distance and a gate depth should have a high aspect ratio. In addition, due to limitations of a process, a gate region is formed in a source region so that a heavily-doped PN junction is formed between the source region and the gate region. This may pose various problems such as inevitable increase in junction current. Further, ion implantation with markedly high energies (about 2 MeV) is necessary for the formation of a termination structure.

A method of forming a gate region by conducting ion implantation at high energies is considered as one of the methods of forming a gate region without forming a trench. In this case, a distance between gate regions can be controlled only by photolithography providing high precision and in addition, a distance between a source region and a gate region can be increased by mask layout. This method however requires high energy implantation so that it does not come to a complete technical resolution.

Means and the like for addressing the above-mentioned problems will hereinafter be described. The other problem and novel features will be apparent from the description herein and accompanying drawings.

The outline of the typical embodiment, among embodiments disclosed herein, will be described below briefly.

The outline of the embodiment of the present application resides in a vertical channel type SiC power JEFT having a floating gate below a source region and between gate regions.

An advantage available by the typical embodiment, among embodiments disclosed herein, will be described below briefly.

According to the one embodiment of the present application, a channel region having a high aspect ratio can be obtained.

DETAILED DESCRIPTION

[Outline of Embodiment]

Figure 1:
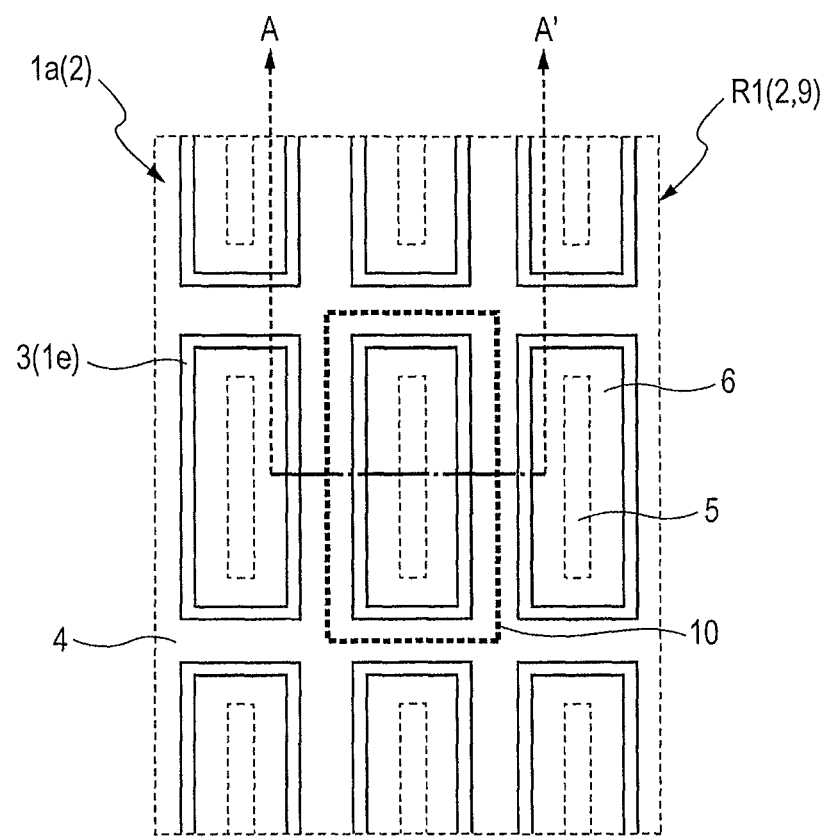
FIG. 1 is a fragmentary plan view of an active cell region for describing one example (source-island type orthogonal lattice arrangement cell structure) of a unit cell structure in a vertical-channel type junction SiC power FET (vertical planar type structure) according to one embodiment of the present application.

First, the outline of typical embodiments disclosed herein will be described.

1. A vertical-channel type junction SiC power FET including:

(a) a SiC semiconductor substrate having a first main surface and a second main surface;

(b) a drift region provided from a surface to an inside on the side of the first main surface of the SiC semiconductor substrate and having a first conductivity type;

(c) a drain region provided in a surface region on the side of the second main surface of the SiC semiconductor substrate, more heavily doped than the drift region, and having the first conductivity type;

(d) an active cell region extending from a surface to an inside of the drift region; and (e) a plurality of unit cell regions provided in the active cell region.

In the FET, each of the unit cell regions includes:

(e1) a source region provided in a surface region of the drift region, more heavily doped than the drift region, and having the first conductivity type;

(e2) a floating region provided in the drift region so as to be below and contiguous to the source region and having a second conductivity type, that is, a conductivity type opposite to the first conductivity type; and (e3) gate regions provided in a surface region of the drift region so as to sandwich therewith the source region and the floating region at least from both sides thereof and having the second conductivity type.

2. In the vertical-channel type junction SiC power FET as described above in 1, a device structure belongs to a planar type.

3. In the vertical-channel type junction SiC power FET as described above in 1 or 2, an operation mode is a normally-on type.

4. In the vertical-channel type junction SiC power FET as described above in any one of 1 to 3, the floating region is formed by ion implantation.

5. In the vertical-channel type junction SiC power FET as described above in any one of 1 to 4, the gate regions are formed by ion implantation.

6. In the vertical-channel type junction SiC power FET as described above in any one of 1 to 5, the floating region is within the width of the source region in a planar view.

7. In the vertical-channel type junction SiC power FET as described above in any one of 1 to 6, the gate regions are arranged in a stripe form in a planar view.

8. In the vertical-channel type junction SiC power FET as described in 7, the gate regions are linked with each other at an end portion of the active cell region in a planar view.

9. In the vertical-channel type junction SiC power FET as described above in any one of 1 to 6, the gate regions are arranged in a mesh form in a planar view.

10. In the vertical-channel type junction SiC power FET as described above in 4, the floating region is formed by multistage ion implantation.

11. In the vertical-channel type junction SiC power FET as described above in any one of 1 to 10, the floating region extends, in a depth direction thereof, at least from a region between the gate regions to a lower end of the gate regions.

12. A method of manufacturing a vertical-channel type junction SiC power FET, having the steps of:

(a) providing an SiC semiconductor wafer having a first main surface and a second main surface, a drift region extending from a surface to an inside of the SiC semiconductor wafer on the side of the first main surface and having a first conductivity type, and a drain region provided in a surface region on the side of the second main surface, more heavily doped than the drift region, and having the first conductivity type; and (b) introducing, from a surface to an inside of the drift region, an active cell region having a plurality of unit cell regions. The step of introducing the active cell region is performed for each of the unit cell regions and includes the sub-steps of:

(b1) introducing, in a surface region of the drift region, a source region more heavily doped than the drift region and having the first conductivity type;

(b2) introducing a floating region having a second conductivity type, which is a conductivity type opposite to the first conductivity type, in the drift region so as to be below and contiguous to the source region; and (b3) introducing gate regions having the second conductivity type in a surface region of the drift region so as to sandwich therewith the source region and the floating region at least from both sides thereof.

13. In the method of manufacturing a vertical-channel type junction SiC power FET as described above in 12, the floating region is introduced by ion implantation.

14. In the method of manufacturing a vertical-channel type junction SiC power FET as described above in 13, the floating region is introduced by multistage ion implantation.

15. In the method of manufacturing a vertical-channel type junction SiC power FET as described above in any of 12 to 14, the gate regions are introduced by ion implantation.

16. In the method of manufacturing a vertical-channel type junction SiC power FET as described above in any one of 12 to 15, a device structure belongs to a planar type.

17. In the method of manufacturing a vertical-channel type junction SiC power FET as described above in any one of 12 to 16, the sub-step (b2) is performed after the sub-step (b3).

18. In the method of manufacturing a vertical-channel type junction SiC power FET as described above in any one of 12 to 17, the sub-step (b2) is performed before the sub-step (b1).

19. In the method of manufacturing a vertical-channel type junction SiC power FET as described above in any one of 12 to 18, the floating region is within the width of the source region in a planar view.

20. In the method of manufacturing a vertical-channel type junction SiC power FET as described above in any one of 12 to 19, the floating region extends, in a depth direction, at least from a region between the gate regions to a lower end of the gate regions.

[Explanation of Description Manner, Basic Terms, and Usage in the Present Application]

1. In the present application, a description in embodiments may be made after divided in a plurality of sections if necessary for convenience's sake. These sections are not independent from each other, but they may each be a part of a single example or one of them may be a partial detail of the other or a modification example of a part or whole of the other one unless otherwise specified. In principle, a description of a portion similar to that described before is not repeated. Moreover, when a reference is made to constituent components in the embodiments, they are not essential unless otherwise specified, limited to the number theoretically, or apparent from the context that they are essential.

Further, the term "semiconductor chip", "semiconductor device", or "semiconductor integrated circuit device" as used herein means mainly a simple transistor (active element) or a device obtained by integrating such a simple device as a main component with a resistor, a capacitor, a diode, and the like on a semiconductor chip or the like (examples of the material of the semiconductor chip include single crystal SiC substrate and single crystal silicon substrate, and composite substrate thereof and in the present application, 4H—SiC is a main crystal polymorph of SiC, but it is needless to say that another crystal polymorph may also be used).

In the present application, the term "electronic circuit device" means a semiconductor chip, a semiconductor device, a semiconductor integrated circuit device, a resistor, a capacitor, a diode, or the like and an interconnected system thereof.

Typical examples of the transistor include a junction FET (junction field effect transistor).

In these days, each of the source and gate metal electrodes of a power-type electronic circuit device, semiconductor device, or semiconductor integrated circuit device usually tends to be made of a single layer which is, for example, an aluminum-based (or refractory metal-based such as tungsten-based) wiring layer M1 or two layers made of aluminum-based (or refractory-metal-based such as tungsten-based) wiring layers M1 and M2. As such wiring layers, copper-based wiring layers are sometimes used. The term "power-type device" usually means a device capable of handling electricity of several watts or greater.

2. Similarly, even when such a term "X comprised of A" or the like is used in association with a material, a composition, or the like in the description of the embodiment or the like, it does not exclude a material, composition, or the like containing an element other than A as one of the main constituent components thereof unless otherwise specified or apparent from the context that it excludes such a material, composition, or the like. For example, with regard to a component, the term means "X containing A as a main component" or the like. It is needless to say that even the term "silicon member", "SiC (silicon carbide) member", or the like is not limited to pure silicon or SiC but embraces a multi-element semiconductor containing silicon or SiC as a main component and a member containing, in addition, another additive and the like. Similarly, it is needless to say that the term "silicon oxide film", "silicon oxide-based insulating film", or the like means not only a relatively pure undoped silicon dioxide but also an insulating film having silicon oxide as a main component thereof. For example, a silicon oxide-based insulating film doped with an impurity such as TEOS-based silicon oxide, PSG (phosphorus silicate glass), or BPSG (borophosphosilicate glass) is also a silicon oxide film. Additional examples of the silicon oxide film or silicon oxide-based insulating film include a thermal oxide film, a CVD oxide film, and a film obtained by the method of application such as SOG (spin on glass) and nano-clustering silica (NSC). Further, low-k insulating films such as FSG (fluorosilicate glass), SiOC (silicon oxycarbide), carbon-doped silicon oxide, and OSG (organosilicate glass) are also silicon oxide films or silicon oxide-based insulating films. Still further, silica-based Low-k insulating films (porous insulating films, in which the term "porous" embraces molecular porous) obtained by introducing voids into the same member as mentioned above are silicon oxide films or silicon oxide-based insulating films.

As silicon-based insulating films, not only silicon oxide-based insulating films but also silicon nitride-based insulating films are ordinarily used in semiconductor fields. Examples of materials belonging to such films include SiN, SiCN, SiNH, and SiCNH. The term "silicon nitride" as used herein means both SiN and SiNH unless otherwise specifically indicated that it is not. Similarly, the term "SiCN" means both SiCN and SiCNH unless otherwise specifically indicated that it does not.

3. Preferred examples of the shape, position, attribute, and the like will be shown below, however, it is needless to say that the shape, position, attribute, and the like are not strictly limited to these preferred examples unless otherwise specifically indicated or apparent from the context that they are strictly limited.

4. Preferred examples of the shape, position, attribute, and the like will be shown below, however, it is needless to say that the shape, position, attribute, and the like are not strictly limited to these preferred examples unless otherwise specifically indicated or apparent from the context that they are strictly limited. Therefore, for example, the term "square" embraces "substantially square"; the term "orthogonal" embraces "substantially orthogonal", and the term "coincide with" embraces "substantially coincide with". This also applies to the terms "parallel" and "right angle". For example, a position away by about 10 degrees from a complete parallel position belongs to the term "parallel".

The term "overall region", "whole region", "entire region", or the like embraces "substantially overall region", "substantially whole region", "substantially entire region" or the like. For example, the term "overall region", "whole region", or "entire region" embraces a portion of the region accounting for 80% or more of the area thereof. This also applies to "whole circumference", "whole length", or the like.

Further, with regard to the shape of a member or the like, the term "rectangular" embraces "substantially rectangular". For example, when a member has a rectangular portion and an unrectangular portion and an area of the latter portion is less than about 20% of the whole area, this member is regarded rectangular. This also applies to the term "cyclic" or the like. In this case, when a cyclic body is divided, a portion having this divided element portion inserted therein or exserted therefrom is a part of the cyclic body.

With regard to the term "periodic", the term "periodic" embraces "substantially periodic". When a difference in periodicity among components is less than about 20%, these components are regarded "periodic". Further, when less than about 20% of the components to be analyzed are outside the above range, these components are regarded "periodic" as a whole.

The definition in this section is a general one. When a different definition is applied to the following individual descriptions, priority is given to the definition used in the individual description. With regard to a portion not specified in the individual description, the definition or specification in this section is effective unless otherwise definitely denied.

5. The term "wafer" typically means a single-crystal silicon carbide wafer, a single-crystal silicon wafer, or the like on which a semiconductor integrated circuit device (the same as a semiconductor device or an electronic device) is formed. It is needless to say that it also embraces a composite wafer of an insulating substrate and a semiconductor layer or the like, such as an epitaxial wafer or an LCD glass substrate.

6. In the present application, a description will be made mainly on, among junction FETs, a vertical type junction (vertical junction) FET having a basic structure having a source electrode on the surface side and a drain electrode on the back surface side. As another example of the junction FET, a lateral type junction (lateral junction) FET having both a source electrode and a drain electrode on the surface side can be given.

The vertical type junction FET is classified into a lateral channel type having a main channel in a lateral direction and a vertical channel type having a main channel in a vertical direction. In the present application, mainly a vertical channel type junction FET will be described.

A specific description of a crystal plane (for example, the main surface of a SiC wafer) on which a device is to be formed will be made with a (0001) plane or a plane equivalent thereto as an example. A plane inclined by an angle within 10 degrees from the above-mentioned planes is also embraced in the plane equivalent thereto. It is needless to say that if necessary, a device may be formed on another crystal plane.

[Details of Embodiment]

Embodiments will next be described more specifically. In all the drawings, the same or like members will be identified by the same or like symbols or reference numerals and overlapping descriptions will be omitted in principle.

In the accompanying drawings, hatching or the like is sometimes omitted even from the cross-section when it makes the drawing cumbersome and complicated or when a member can be discriminated clearly from a vacant space. In relation thereto, even a two-dimensionally closed hole may have a background outline thereof omitted when it is obvious from the description or the like that the hole is two-dimensionally closed. On the other hand, even a portion other than a cross section may be hatched to clearly show that the hatched portion is not a vacant space.

With regard to alternative naming, when one of the two is called "first" and the other is called "second", they are sometimes named according to the typical embodiment, but needless to say, their naming is not limited to this choice.

1. Example of Unit Cell Structure (Source-Island Orthogonal Lattice Arrangement Cell Structure) of Vertical-Channel Type Junction SiC Power FET (Vertical Planar Type Structure) According to One Embodiment of Present Application (Mainly FIG. 1 and FIG. 2)

This section describes the outline of a basic example to be described in Section 2 while referring to a schematically cutaway portion of a unit cell region and an active cell region which clearly show the characteristics of the example.

Figure 2:
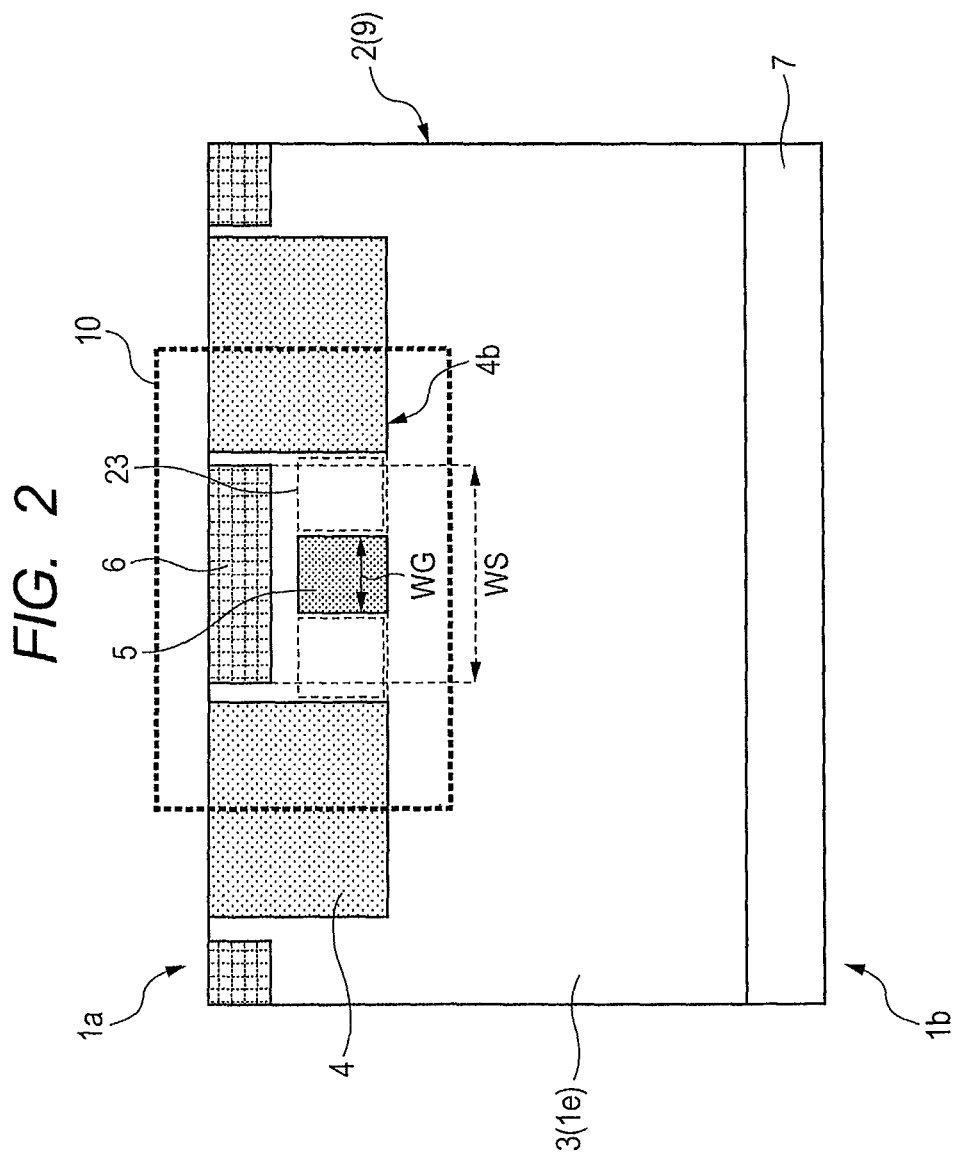
FIG. 2 is a schematic cross-sectional view of a unit cell corresponding to the A-A' cross-section of FIG. 1 and regions around the unit cell.

FIG. 1 is a fragmentary plan view of an active cell region for describing one example (source-island type orthogonal lattice arrangement cell structure) of a unit cell structure in a vertical-channel type junction SiC power FET (vertical planar type structure) according to one embodiment of the present application. FIG. 2 is a schematic cross-sectional view of a unit cell corresponding to the A-A' cross-section of FIG. 1 and regions around the unit cell. Based on these drawings, one example of the unit cell structure (source-island type orthogonal lattice arrangement cell structure) in the vertical-channel type junction SiC power FET according to the one embodiment of the present application will be described.

First, a schematic device structure from which the surface structure such as electrodes and insulating films on the surface and back surface has been omitted will be described. A schematic top view corresponding to an internal partially cutaway portion R1 of an active cell region 9 of a semiconductor chip 2 of a vertical-channel type junction SiC power FET is shown in FIG. 1. In this example, as shown in FIG. 1, the semiconductor substrate 2 (for example, SiC substrate) in the active cell region 9 has, on a surface 1a thereof, a number of unit cell regions 10 in an orthogonal lattice form. The orientation of this orthogonal lattice corresponds to, for example, that of the lattice-form arrangement of chips on a wafer and a direction of sides of each of the chips adjacent to each other.

Each of the unit cell regions 10 is comprised of a P type gate region 4 (normal gate region) at the periphery thereof, an N+ type source region 6 formed inside of the gate region, a P type floating region 5 (floating gate region) formed inside of the source region, and the like. The P type gate region 4 and the N+ type source region 6 are separated from each other by an N− type drift region 3 (for example, an N− type SiC epitaxy layer 1e). In this layout, the P type gate region 4 is totally in a mesh form in a planar view.

Next, the A-A' cross-section of FIG. 1 is shown in FIG. 2. As shown in FIG. 2, the semiconductor substrate 2 has, in a surface region on the side of a back surface 1b (second main surface) thereof, an N+ type drain region 7 having a uniform thickness. On the other hand, the semiconductor substrate 2 has, from the surface to the inside on the side of the surface 1a (first main surface) thereof, an N− type drift region 3 (for example, an N− type SiC epitaxy layer 1e) having a substantially uniform thickness. The N+ type drain region 7 has an impurity concentration greater than that of the N− type drift region 3. These regions each have an N conductivity type (for example, a first conductivity type) so that they have the same conductivity type.

The N− type drift region 3 (drift region) has, in the surface region thereof, the N+ type source region 6 (source region) having a concentration greater than that of the N− type drift region 3. The N− type drift region 3 has therein the P type floating region 5 (floating region or floating gate region) below and in the vicinity of the N+ type source region 6. The floating region 5 has a conductivity type (second conductivity type) opposite to that of the N− type drift region 3.

The P type gate region 4 is provided from the surface to the inside of the N− type drift region 3 so as to sandwich the floating region 5 and the source region 6 from at least both sides thereof. This gate region may be either a single region (in this example, for example, a single region in a mesh form) or an assembly of a plurality of regions.

Thus, the active cell region 9 is provided from the surface to the inside of the drift region 3 and the active cell region 9 has therein a plurality of unit cell regions 10. This device structurally belongs to a so-called planar type structure. With regard to an operation mode, it is a so-called normally on type. Needless to say, the operation mode of the device may be a so-called normally on type.

In this example, the N+ type source region 6, the P type floating region 5, the P type gate region 4, and the like are formed by ion implantation. In this example, for example, the P type floating region 5 is formed by multistage ion implantation.

As is apparent from FIG. 2, in this example, the floating region 5 is within the width WS of the source region 6 in a planar view. The width WS (for example, about 3 micrometers) of the source region 6 and the width WG (for example, about 1 micrometer) of the floating region 5 can be given as a preferred example.

Similarly, the floating region 5 extends, in a depth direction, at least from a region between the gate regions 4 to a lower end 4b of the gate region 4.

As shown in FIG. 2, the current path in a channel portion 23 (portion substantially limiting the flow of an electric current) is mainly in a vertical direction so that this device structure belongs to a vertical-channel type junction FET.

In addition to the main gate region 4, the P type floating region 5 (auxiliary gate region) is provided as a floating region. It achieves shallow junction of the gate layer and as a result, has the advantage that ion implantation at high energies becomes unnecessary.

Further, the auxiliary gate region 5 provided as a floating region has the advantage that a lead wiring becomes unnecessary.

Similarly, shallow junction of the gate layer has the advantage that ion implantation in a junction termination region at high energies becomes unnecessary.

The distance of the main gate region 4 can be set at relatively wide so that such a structure has the advantage that a distance with the source region 6 can be made relatively wide.

Since in such a structure, the main gate region 4 has thereon no region, a metal gate wiring can be laid out right above the main gate region 4. Such a layout is effective for reducing gate resistance.

Moreover, this device is a vertical-channel type device so that an increase in breakdown voltage can be achieved easily by increasing the aspect ratio of a channel region. On the other hand, an increase in breakdown voltage of a lateral-channel type device is difficult because an increase in the aspect ratio of a channel region leads to a proportional increase of a device size.

The device in this example operates in a normally on mode so that it has the advantage of excellent switching characteristics and relatively easy manufacture. Alternatively, the device can operate in a normally off mode after adjustment of the concentration or the like of each region.

Further, the device structure having a planar structure has the advantage of manufacturing ease.

The auxiliary gate region 5 formed by ion implantation can omit additional etching or epitaxy process because ion implantation facilitates minute processing. This auxiliary gate region 5 is formed by multistage ion implantation, which can increase the aspect ratio of the channel region and thereby increase the breakdown voltage of the device.

Similarly, the main gate region 4 formed by ion implantation can omit additional etching or epitaxy process because ion implantation facilitates minute processing.

The auxiliary gate region 5 is within the width of the source region 6 in a planar view. This facilitates downsizing of the device.

The auxiliary gate region 5 extends, in the depth direction thereof, from a region between the main gate regions 4 to the lower end (or the vicinity) thereof so that a sufficient channel length can be secured.

2. Description of an Overall Layout (Source-Island Type Orthogonal Lattice Arrangement Cell Structure) of a Chip in the Vertical-Channel Type Junction SiC Power FET (Vertical Planar Type Structure) According to the Embodiment of the Present Application (Mainly, from FIG. 3 to FIG. 6)

In this section, the overall structure of the device corresponding to the structure of the unit cell region 10 (FIG. 1, FIG. 2) described above in Section 1 will be described. In the following example, only a portion not described in Section 1 will be described in principle.

Figure 3:
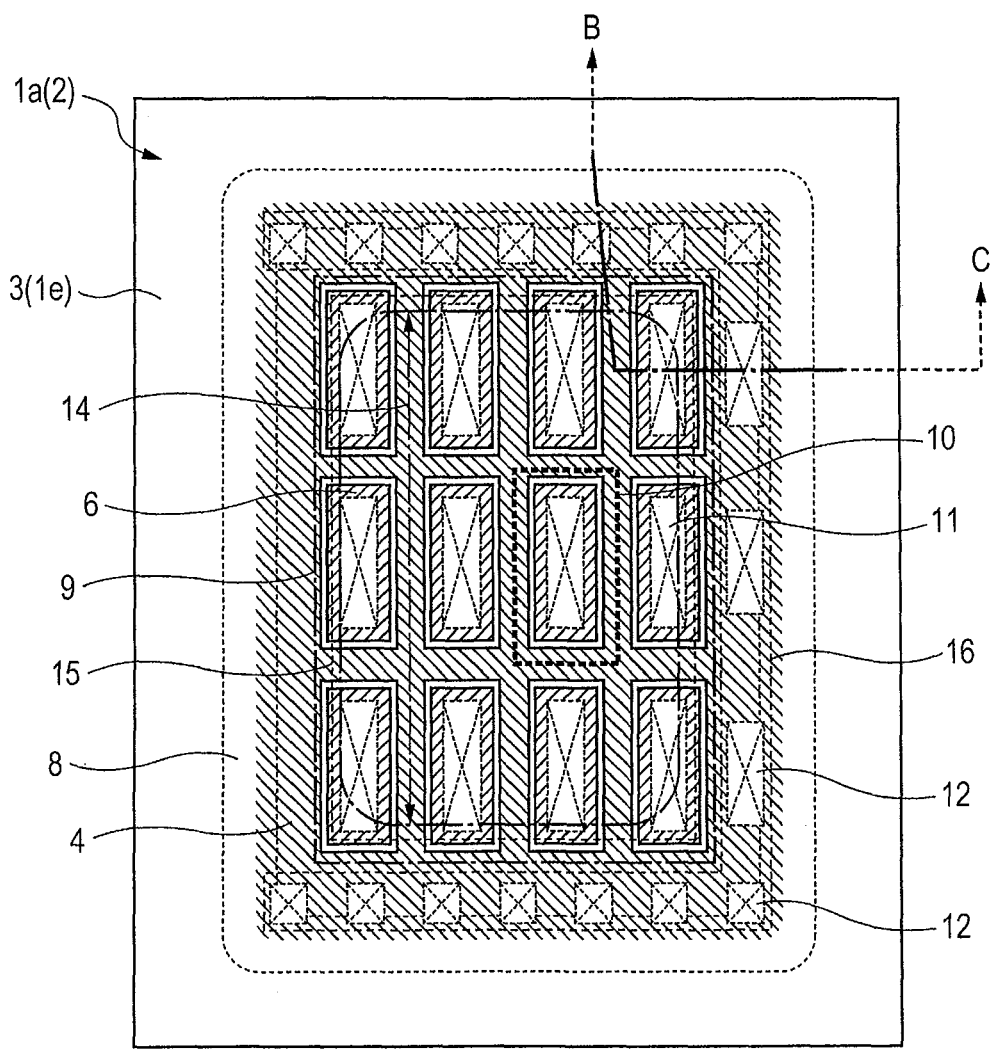
FIG. 3 is an overall top view (including an upper-surface metal structure) of a chip for describing an overall chip layout (source-island type orthogonal lattice arrangement cell structure) in the vertical-channel type junction SiC power FET (vertical planar type structure) according to the one embodiment of the present application.
Figure 4:
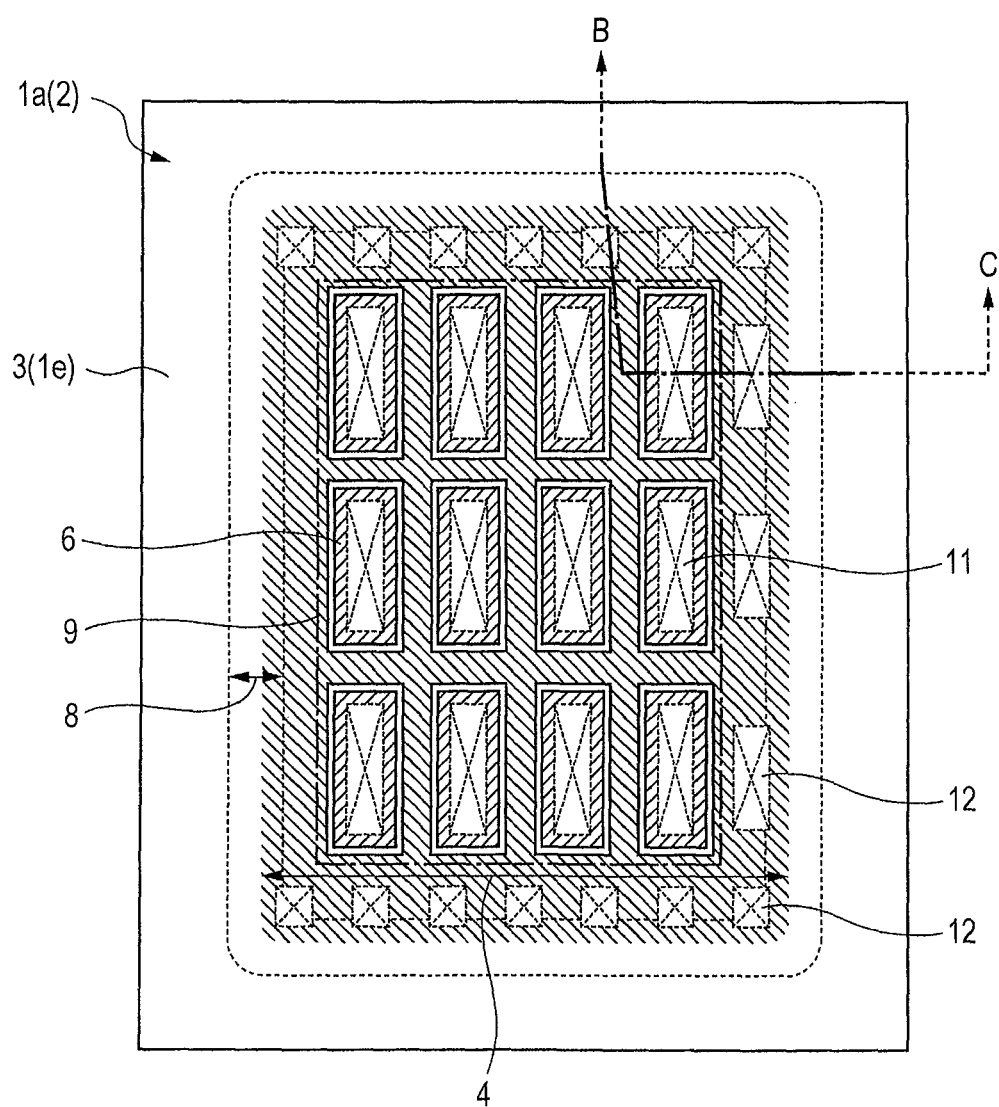
FIG. 4 is an overall top view (showing an emphasized contact portion while removing the upper-surface metal structure) of the chip corresponding to FIG. 3.
Figure 5:
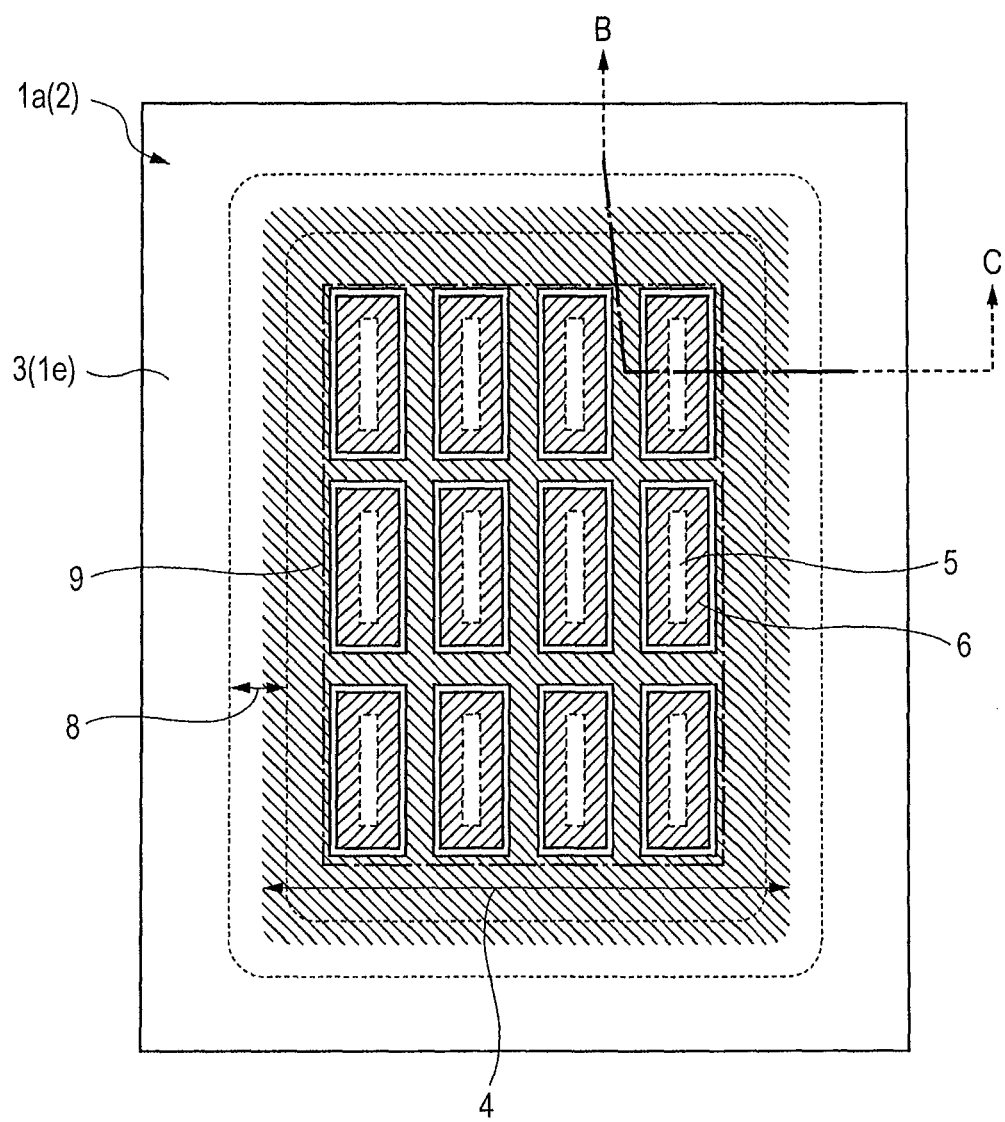
FIG. 5 is an overall top view (showing an emphasized impurity region while removing the upper-surface metal structure) of the chip corresponding to FIG. 3.
Figure 6:
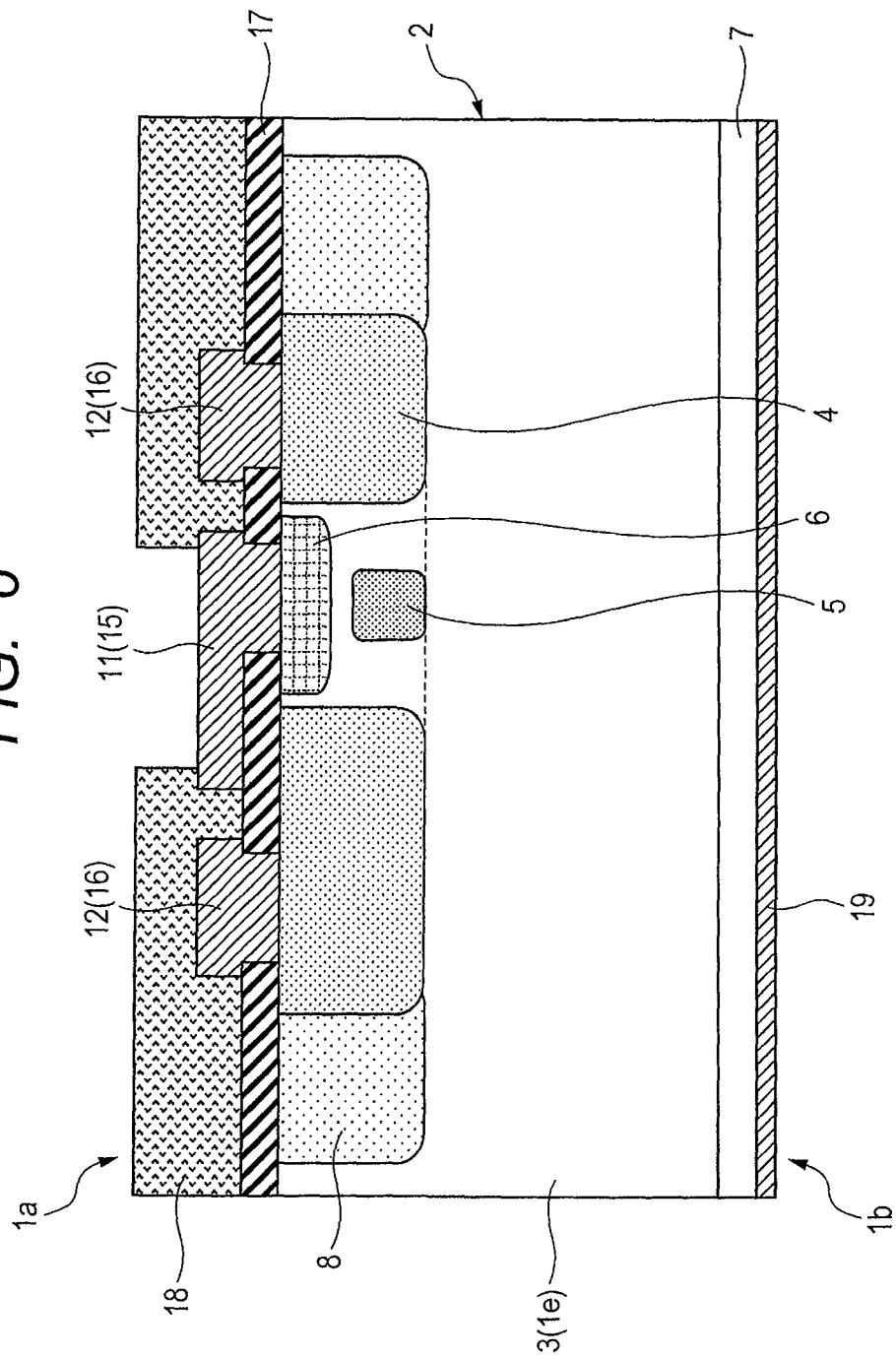
FIG. 6 is a device cross-sectional view corresponding to the B-C cross-section of FIG. 3.

FIG. 3 is an overall top view (including an upper-surface metal structure) of a chip for describing an overall chip layout (source-island type orthogonal lattice arrangement cell structure) in the vertical-channel type junction SiC power FET (vertical planar type structure) according to the one embodiment of the present application. FIG. 4 is an overall top view (showing an emphasized contact portion while removing the upper-surface metal structure) of the chip corresponding to FIG. 3. FIG. 5 is an overall top view (showing an emphasized impurity region while removing the upper-surface metal structure) of the chip corresponding to FIG. 3. FIG. 6 is a device cross-sectional view corresponding to the B-C cross-section of FIG. 3. Based on these drawings, the overall layout (source-island type orthogonal lattice arrangement cell structure) and the like of a chip of the vertical-channel type junction SiC power FET (vertical planar type structure) according to the one embodiment of the present application will next be described.

The overall layout of the surface 1a of the chip 2 is shown in FIGS. 3 to 5. As shown in FIGS. 3 to 5, the chip 2 has, at the periphery thereof, the N− type drift region 3, that is, the N− type SiC epitaxy layer 1e and the drift region has, inside thereof, a ring-shaped P type junction termination region 8, that is, a junction termination extension region.

The p type junction termination region 8 has inside thereof, an outer peripheral portion of the P type gate region 4 (normal gate region) and this gate region has, at the outer peripheral portion thereof, gate contact portions 12 and a metal gate wiring 16 (metal gate electrode) that links them with each other. The P type gate region 4 further has, inside the outer peripheral portion thereof, for example, in the active cell region 9, the unit cell regions 10 arranged in an orthogonal lattice form.

A substantially whole region of the active cell region 9 is covered with a metal source electrode 15 and this metal source electrode 15 is electrically coupled to a source contact portion 11 of each of the unit cell regions 10. The metal source electrode 15 has, in an inside region thereof, for example, a source pad opening 14 (opening portion of a final passivation film).

Next, the B-C cross-section of FIG. 3 to FIG. 5 is shown in FIG. 6. As is apparent from FIG. 6, the semiconductor substrate 2 has, in a surface region on the side of the back surface 1b (second main surface) of the semiconductor substrate 2, the N+ type drain region 7 having, for example, a uniform thickness. The semiconductor substrate 2 has, on the back surface 1b thereof, a back-surface metal electrode film 19 (metal drain electrode film).

On the other hand, the semiconductor substrate 2 has, from the surface to the inside thereof on the side of the surface 1a (first main surface), has, in this example, the N– type drift region 3 (for example, N– type SiC epitaxy layer 1e) having a substantially uniform thickness.

The N– type drift region 3 (drift region) has, in the surface region thereof, the N+ type source region 6 (source region) more heavily doped than the N– type drift region 3. The N– type drift region 3 has therein the P type floating region 5 (floating region or floating gate region) so as to be below and at the same time, contiguous to this N+ type source region.

The N– type drift region 3 has, from the surface to the inside thereof, the P type gate region 4 so as to sandwich therewith the floating region 5 and the source region 6 at least from both sides of these regions. Further, the P type gate region 4 has, outside thereof, the p type junction termination region 8.

The semiconductor substrate 2 has, on the surface 1a thereof, for example, an interlayer insulating film 17 such as silicon oxide film. This interlayer insulating film 17 has thereon the metal source electrode 15 and is electrically coupled to the N+ type source region 6 via the source contact portion 11. The interlayer insulating film 17 has thereon the metal gate wiring 16 (metal gate electrode) and is electrically coupled to the P type gate region 4 (normal gate region) via the gate contact portion 12. The interlayer insulating film 17, the metal source electrode 15, the metal gate wiring 16, and the like are covered, except for a portion of them, with a final passivation film 18.

As described above, in the source-island type layout (the present example and the example of sub-sections (1) and (2) of Section 5), the source region 6 and the auxiliary gate region 5 (P type floating region) are both in an island form, which provides the advantage that freedom of the layout of the main gate region 4 (P type gate region) becomes large. The auxiliary gate region 5, if it is not a floating region, has difficulty in leading of an electrode, but in the above example, the gate region is a floating region so that no problem occurs. In a planar view, the auxiliary gate region 5 is within the source region 6 (is included therein) so that areal effectiveness of such a structure is markedly high.

3. Description of One Example of a Manufacturing Process Corresponding to an Overall Layout (Source-Island Type Orthogonal Lattice Arrangement Cell Basic Structure) of the Chip in the Vertical-channel Type Junction SiC Power FET (Vertical Planar Type Structure) According to the Embodiment of the Present Application (Mainly, FIGS. 7 to 14)

In this section, one example of a manufacturing process corresponding to the device structure described in Section 2 will be described. It is however a simple example and needless to say, it can be modified in various ways.

A specific description will hereinafter be made with a device having a source-drain breakdown voltage of about 1000V as an example. Needless to say, however, the breakdown voltage is not limited to it.

Figure 7:
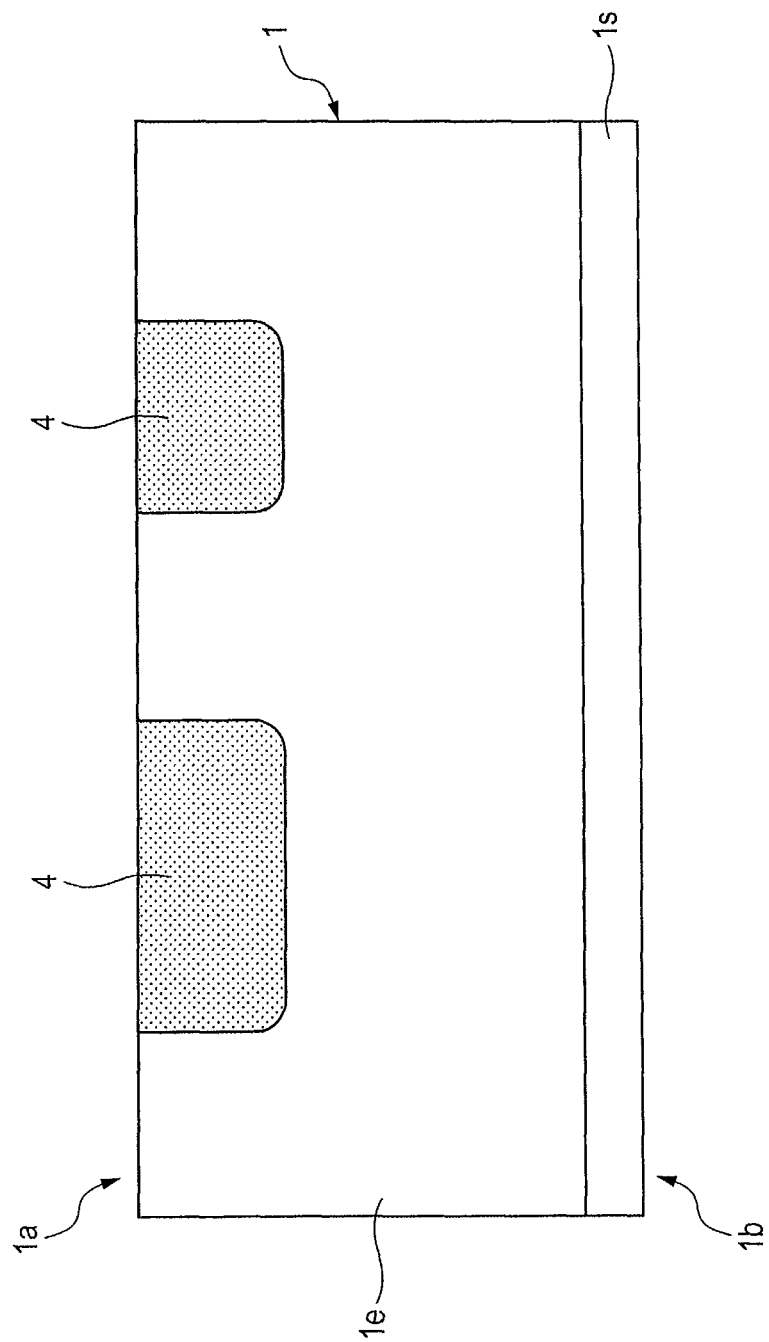
FIG. 7 is a device cross-sectional view, corresponding to FIG. 6, during a manufacturing step (gate region introduction step) for describing one example of a manufacturing process corresponding to the overall chip layout (source-island type orthogonal lattice arrangement cell basic structure) in the vertical-channel type junction SiC power FET (vertical planar type structure) according to the one embodiment of the present application.
Figure 8:
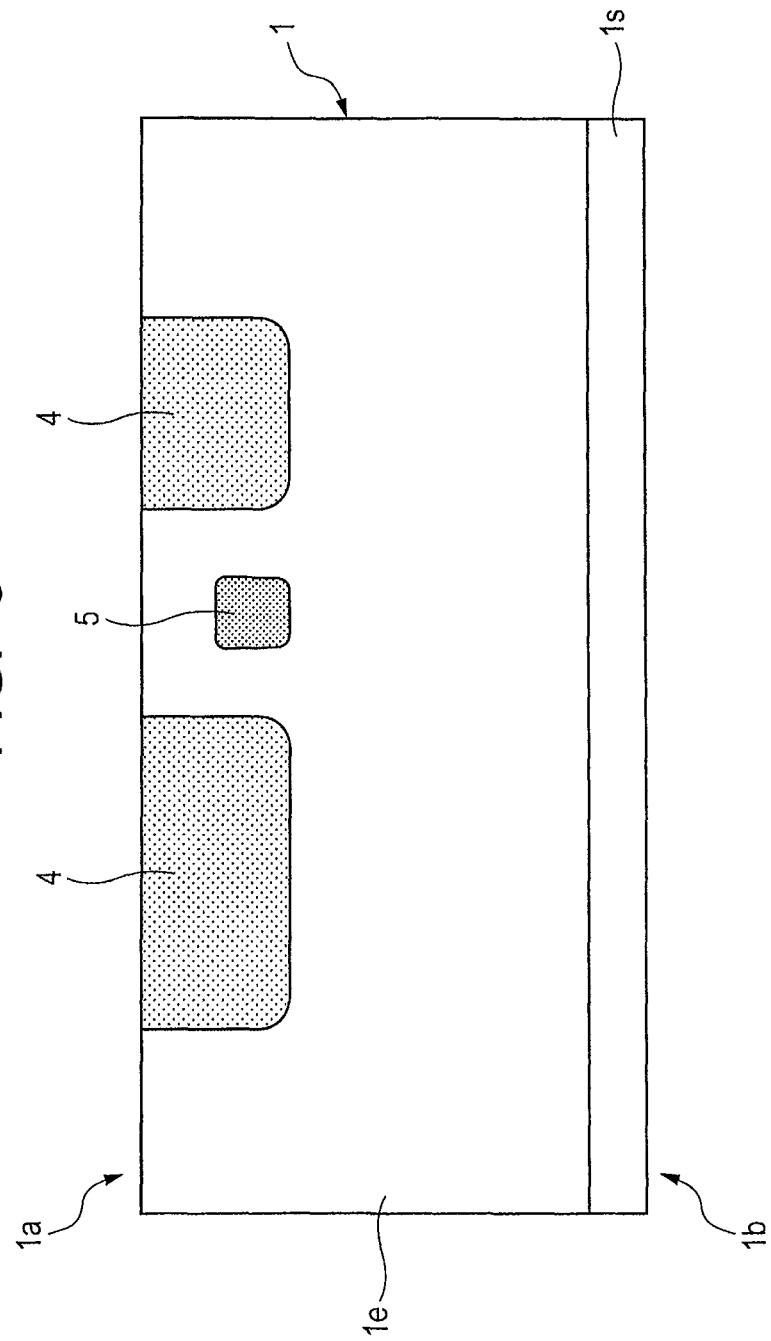
FIG. 8 is a device cross-sectional view, corresponding to FIG. 6, during a manufacturing step (floating region introduction step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application.
Figure 9:
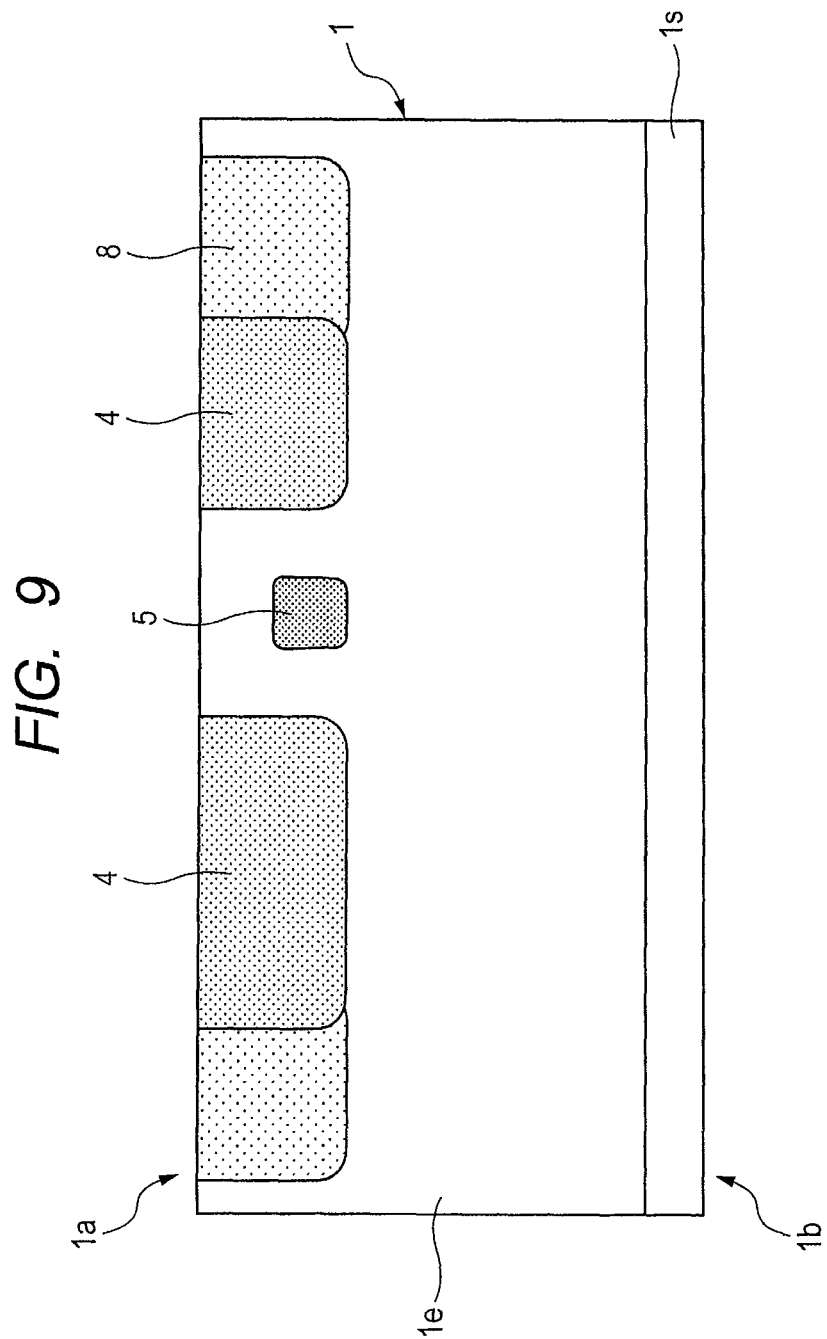
FIG. 9 is a device cross-sectional view, corresponding to FIG. 6, during a manufacturing step (junction termination region introduction step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application.
Figure 10:
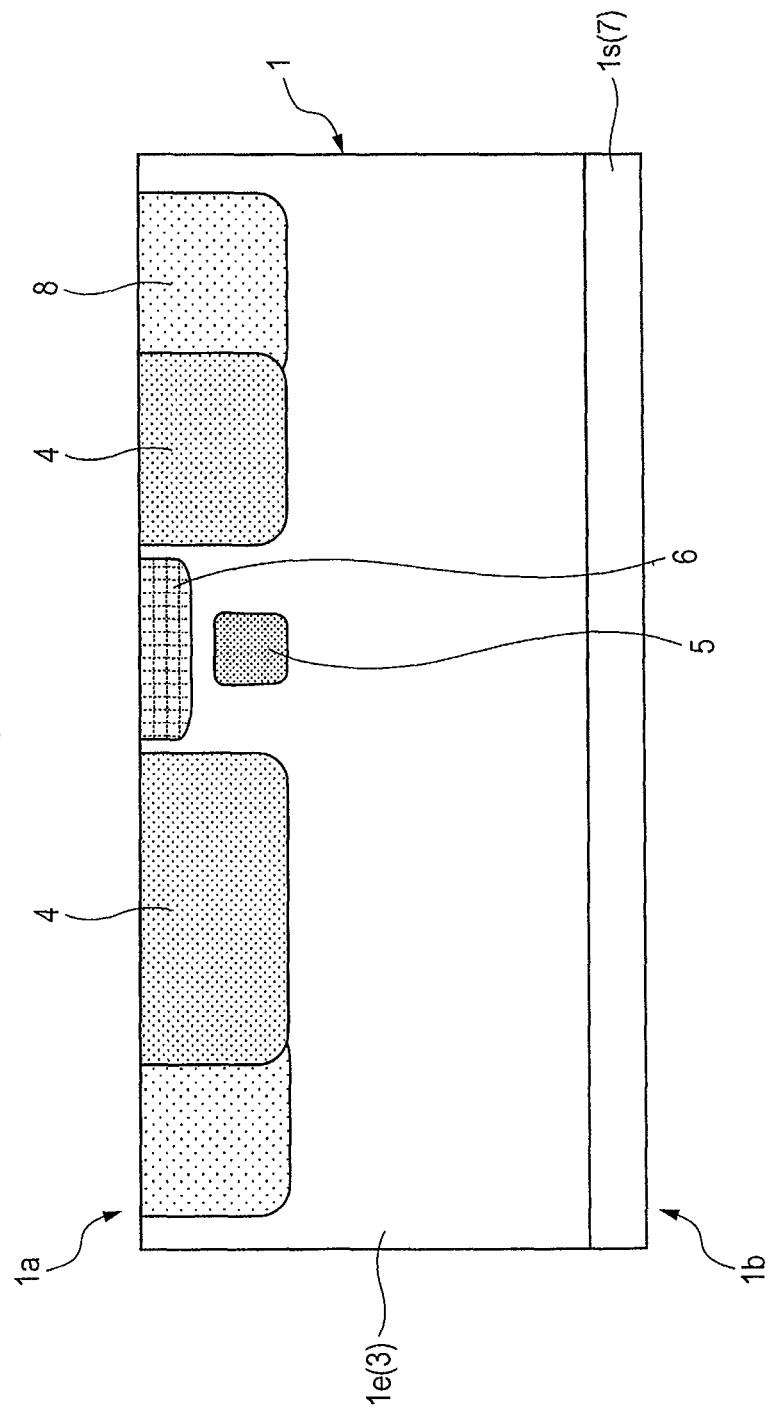
FIG. 10 is a device cross-sectional view, corresponding to FIG. 6, during a manufacturing step (source region introduction step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application.
Figure 11:
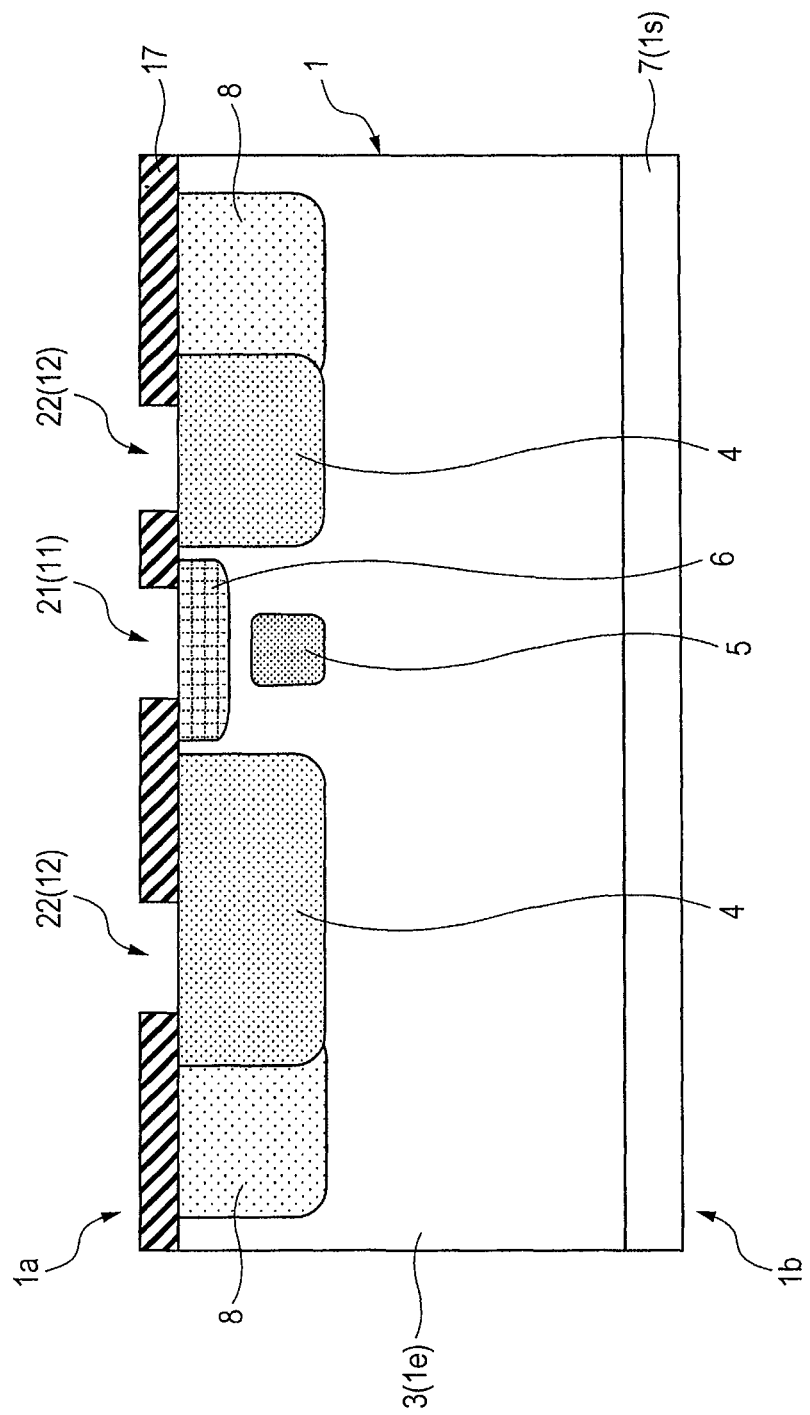
FIG. 11 is a device cross-sectional view, corresponding to FIG. 6, during a manufacturing step (interlayer insulating film formation & processing step) for describing the one example of a manufacturing process corresponding to the overall chip layout (source-island type orthogonal lattice arrangement cell basic structure) in the vertical-channel type junction SiC power FET (vertical planar type structure) according to one embodiment of the present application.
Figure 12:
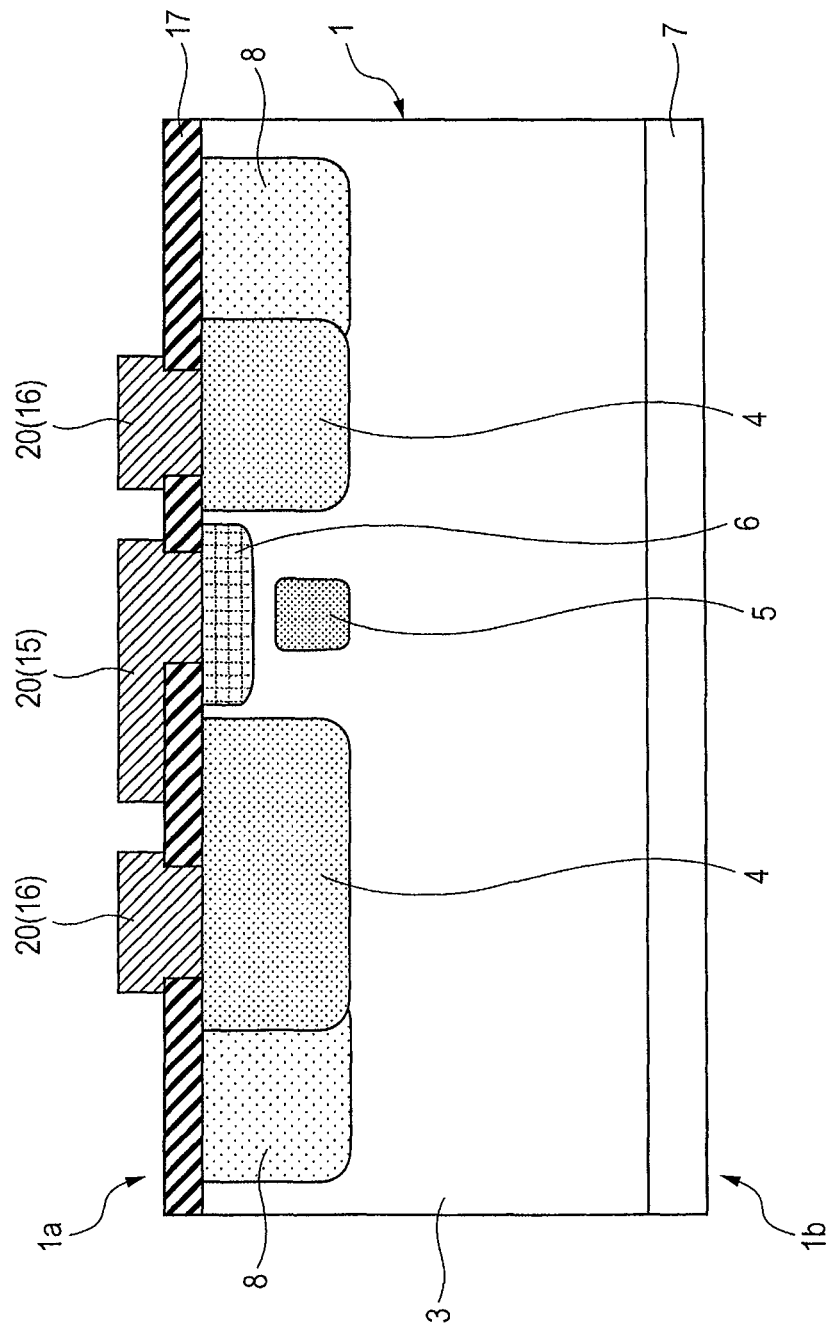
FIG. 12 is a device cross-sectional view, corresponding to FIG. 6, during a manufacturing step (surface metal film formation & processing step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application.
Figure 13:
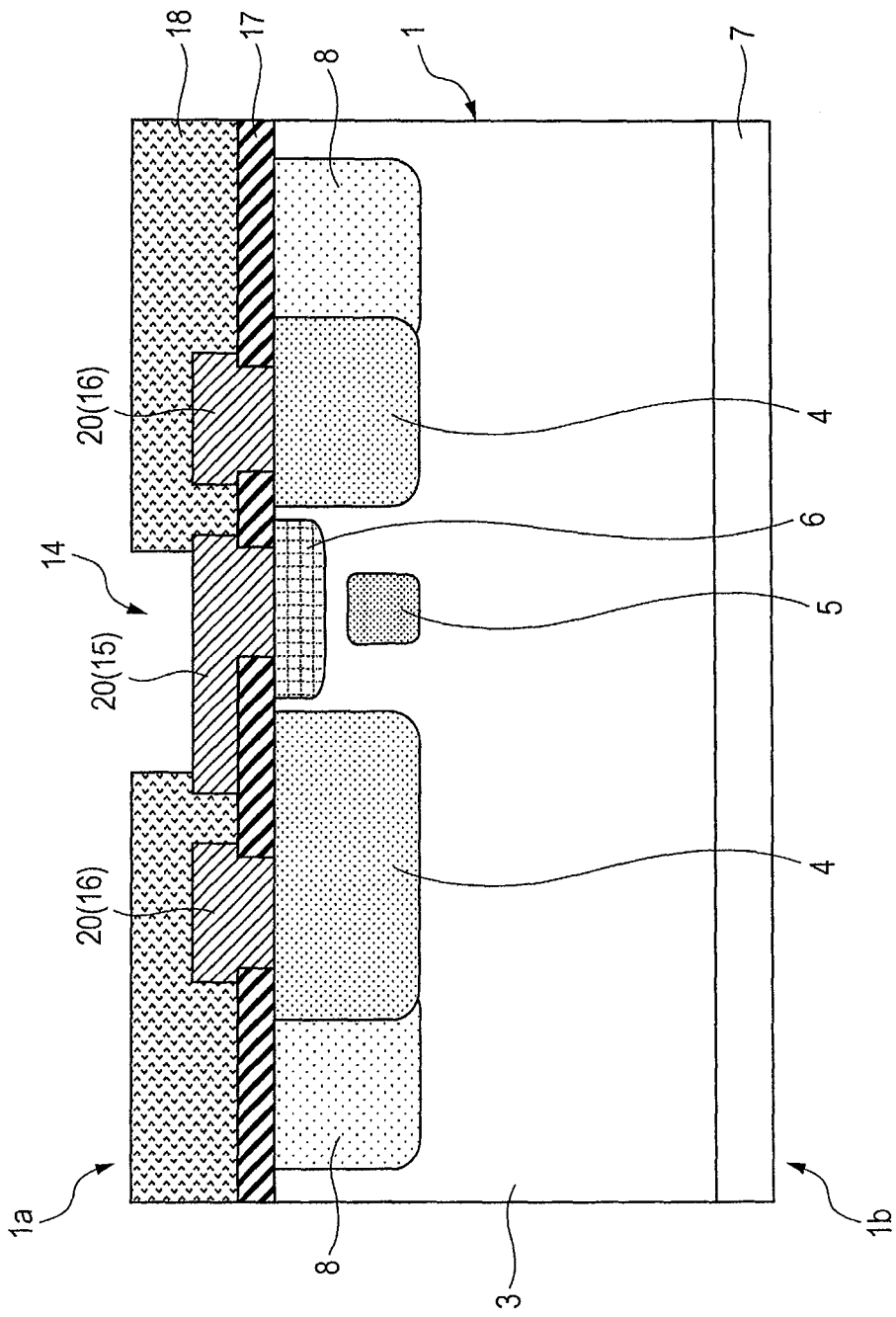
FIG. 13 is a device cross-sectional view, corresponding to FIG. 6, during a manufacturing step (final passivation film formation & processing step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application.
Figure 14:
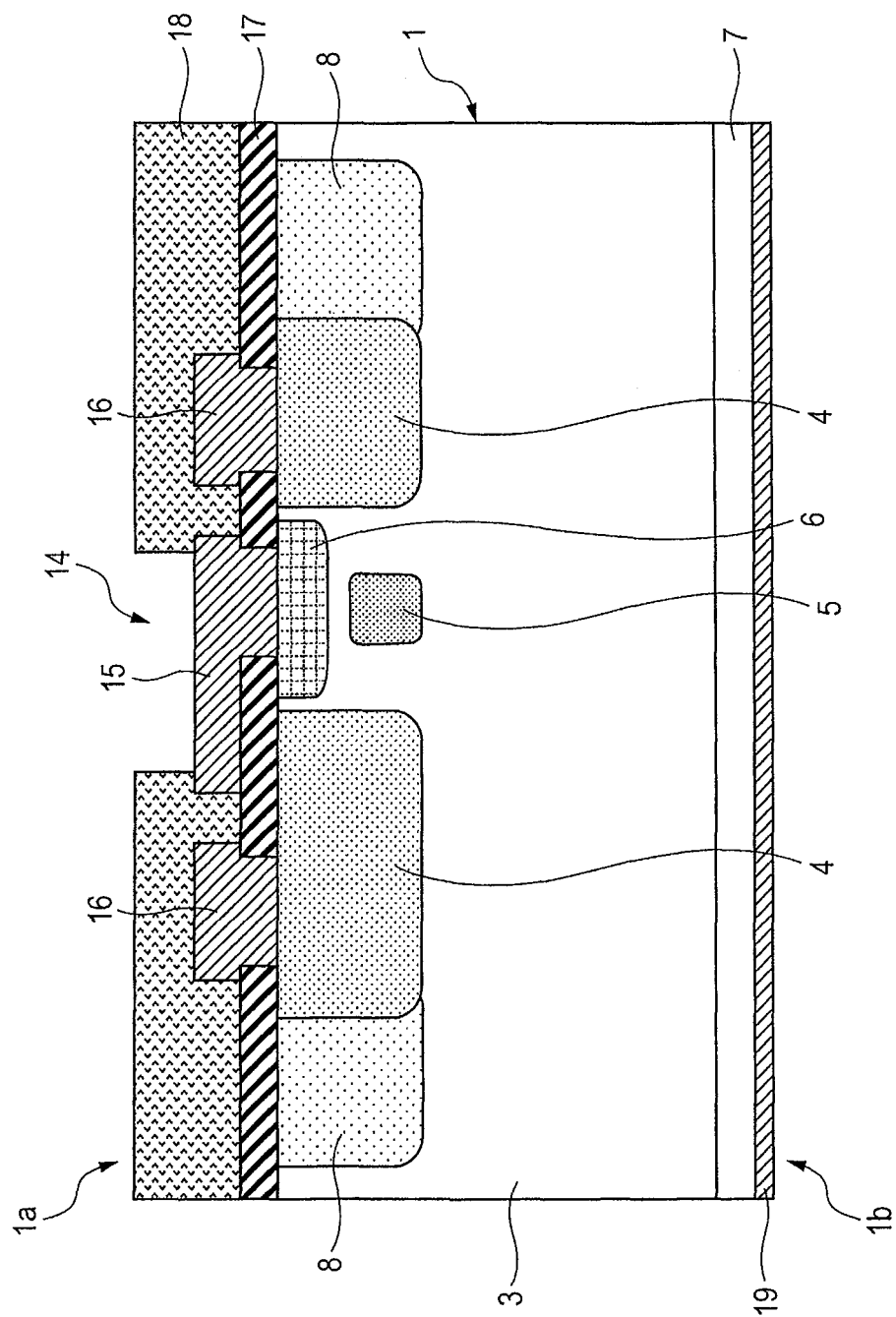
FIG. 14 is a device cross-sectional view, corresponding to FIG. 6, during a manufacturing step (back-surface metal film formation & processing step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application.

FIG. 7 is a device cross-sectional view, corresponding to FIG. 6, during a manufacturing step (gate region introduction step) for describing one example of a manufacturing process corresponding to the overall chip layout (source-island type orthogonal lattice arrangement cell basic structure) in the vertical-channel type junction SiC power FET (vertical planar type structure) according to the one embodiment of the present application. FIG. 8 is a device cross-sectional view, corresponding to FIG. 6, during a manufacturing step (floating region introduction step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application. FIG. 9 is a device cross-sectional view, corresponding to FIG. 6, during a manufacturing step (junction termination region introduction step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application. FIG. 10 is a device cross-sectional view, corresponding to FIG. 6, during a manufacturing step (source region introduction step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application. FIG. 11 is a device cross-sectional view, corresponding to FIG. 6, during a manufacturing step (interlayer insulating film formation & processing step) for describing the one example of a manufacturing process corresponding to the overall chip layout (source-island type orthogonal lattice arrangement cell basic structure) in the vertical-channel type junction SiC power FET (vertical planar type structure) according to one embodiment of the present application. FIG. 12 is a device cross-sectional view, corresponding to FIG. 6, during a manufacturing step (surface metal film formation & processing step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application. FIG. 13 is a device cross-sectional view, corresponding to FIG. 6, during a manufacturing step (final passivation film formation & processing step) for describing the one example of a manufacturing process corresponding to the overall chip layout (source-island type orthogonal lattice arrangement cell basic structure) in the vertical-channel type junction SiC power FET (vertical planar type structure) according to the one embodiment of the present application. FIG. 14 is a device cross-sectional view, corresponding to FIG. 6, during a manufacturing step (back-surface metal film formation & processing step) for describing the one example of a manufacturing process corresponding to the overall chip layout (source-island type orthogonal lattice arrangement cell basic structure) in the vertical-channel type junction SiC power FET (vertical planar type structure) according to one embodiment of the present application. Based on these drawings, the one example of a manufacturing process corresponding to the overall chip layout (source-island type orthogonal lattice arrangement cell basic structure) in the vertical-channel type junction SiC power FET (vertical planar type structure) according to the one embodiment of the present application will next be described.

First, as shown in FIG. 7, for example, an N type SiC semiconductor wafer (having, for example, a resistivity of about 20 mmΩcm) is provided. This SiC wafer 1 (for example, 4H polytype) has a diameter of 76ϕ (it may have a diameter of 100ϕ or 150ϕ, or another diameter) and the crystal plane of the main surface is, for example, (0001) or equivalent thereto. The wafer has a thickness of, for example, about 350 micrometer (the thickness falls within a range of from about 100 to 900 micrometer as needed). A wafer having a main orientation flat and a sub-orientation flat (these orientation flats are perpendicular to each other) is used. With regard to the crystal orientation, for example, the main orientation flat has a [1-100] direction and a direction opposite to the sub-orientation flat is, for example, a [11-20] direction. It is not always necessary but in this example, each side of each of the chips (rectangle) is substantially parallel to either of the orientation flats.

The crystal plane of the main surface 1a is not only, for example, a (0001) plane itself or plane equivalent thereto itself, but needless to say, it may also be a (0001) plane similar to them in properties of the crystal plane or a plane inclined by not greater than 10 degrees to a predetermined direction from the plane equivalent thereto. The inclination direction is, for example, [1, 1, −2, 0] direction.

The polytype is not limited to 4H and it may be 6H or another one as needed. Further, the crystal plane may be a plane other than the (0001) plane or the plane equivalent thereto.

Next, as shown in FIG. 7, an N− type SiC epitaxy layer 1e (impurity concentration of, for example, about $1\times10^{16}/cm^3$) having, for example, a thickness of about 10 micrometers (in the case where the breakdown voltage is about 1000V), which is varied according to a breakdown voltage, is formed on the side of a surface 1a of an N+ type SiC semiconductor wafer 1s.

Next, ion implantation is performed from the side of the surface 1a of the wafer 1 to introduce therein a P type gate region 4 (normal gate region) having, for example, a depth of about 1 micrometer. This ion implantation can be divided into two sections. The process of the first section is carried out to obtain a junction with a vertical side surface and preferred examples include ion implantation under the following conditions: aluminum as an ion source, a vertical implantation angle, implantation in five stages, and an implantation dose of each stage within a range of from about $1\times10^{13}/cm^2$ to $5\times10^{14}/cm^2$. This means that implantation is performed in plural stages while changing the implantation energy within an implantation energy range of from about 100 KeV to 700 KeV so as to achieve respectively different implantation depths. An implantation temperature (wafer temperature at the time of ion implantation) is normal temperature unless otherwise specified. Such multistage implantation is effective for obtaining the P type gate region 4 having a vertical side wall and is effective for forming a channel region with a high aspect ratio.

Similarly, the process of the second section is carried out for reducing contact resistance. Preferred examples of it include ion implantation under the following conditions: aluminum as an ion source, a vertical implantation angle, implantation in two stages, and ion dose of each stage within a range of from about $1\times10^{15}/cm^2$ (at an implantation temperature of, for example, about 500° C.) This means that implantation is performed in plural stages while changing the implantation energy within an implantation energy range of from about 20 KeV to 100 KeV so as to achieve respectively different implantation depths. Thermal treatment after ion implantation may be performed after each of the stages, but in the example shown below, it is performed once after completion of these stages.

Next, as shown in FIG. 8, ion implantation is performed from the side of the surface 1a of the wafer 1 to introduce therein a P type floating region 5 (floating gate region) having, for example, a depth of about 1 micrometer. Preferred examples of this ion implantation process include that under the following conditions: aluminum as an ion source, a vertical implantation angle, implantation in two stages, and an ion dose of each stage within a range of from about $1\times10^{12}/cm^2$ to $3\times10^{13}/cm^2$. This means that implantation is performed in plural stages while changing the implantation energy within an implantation energy range of from about 400 KeV to 700 KeV so as to achieve respectively different implantation depths. Thermal treatment after ion implantation may be performed after each of the stages, but in the example shown here, it is performed once after completion of these stages. Ion implantation may be performed in a single stage, but multistage ion implantation is advantageous from the standpoint of forming a vertical side surface under control.

Next, as shown in FIG. 9, ion implantation is performed from the side of the surface 1a of the wafer 1 to introduce therein a P type junction termination region 8 having, for example, a depth of about 1 micrometer (preferably in a range of, for example, from about 0.3 to 1.0 micrometer). An ion dose is set so as to achieve complete depletion at the time of maximum reverse bias. Preferred examples of this ion implantation process include that under the following conditions: aluminum as an ion source, a vertical implantation angle, implantation in eight stages, and an ion dose of each stage within a range of from about $1\times10^{11}/cm^2$ to $5\times10^{12}/cm^2$. This means that implantation is performed in plural stages while changing the implantation energy within an implantation energy range of from about 100 KeV to 700 KeV so as to achieve respectively different implantation depths. Thermal treatment after ion implantation may be performed after each of the stages, but in the example shown below, it is performed once after completion of these stages.

Next, as shown in FIG. 10, ion implantation is performed, for example, from the side of the surface 1a of the wafer 1 to introduce therein, for example, a relatively shallow N+ type source region 6. Preferred examples of this ion implantation process include ion implantation under the following conditions: nitrogen as an ion source, a vertical implantation angle, implantation in three stages, and a dose of each stage within a range of from about $1\times10^{15}/cm^2$ to $2\times10^{15}/cm^2$. This means that implantation is performed in plural stages while changing the implantation energy within an implantation energy range of from about 50 KeV to 200 KeV so as to achieve respectively different implantation depths. When the dose is from about $1\times10^{15}/cm^2$ to $2\times10^{15}/cm^2$, the implantation temperature (wafer temperature during ion implantation) is preferably set at, for example, about 700° C. (within a range of from 300 to 800° C.) Then, activating thermal treatment is performed, for example, for about one minute in an inert gas atmosphere (for example, at about 1700° C.)

Then, as shown in FIG. 11, a silicon oxide insulating film (for example, a TEOS—$SiO_2$ film) having a thickness of, for example, about 500 nm is formed on the surface 1a of the wafer 1 as an interlayer insulating film 17, for example, by CVD (chemical vapor deposition). Then, for example, typical lithography is performed to process the interlayer insulating film 17 into a source contact opening 21, a gate contact opening 22, and the like.

Then, as shown in FIG. 12, a silicide film such as nickel silicide film is formed in, for example, the source contact opening 21 and the gate contact opening 22 (together with formation of a silicide film on the back surface 1b) to reduce contact resistance. Preferred examples of this silicidation annealing include that under the following conditions: in an argon atmosphere, at a temperature of about 1000° C., for about one or two minutes. Then, as shown in FIG. 12, a surface metal film 20 is formed by sputtering film formation. Preferred examples of the surface metal film 20 include a film comprised of, in order from the bottom, a titanium film (for example, about 50 nm thick), a titanium nitride film (for example, about 50 nm thick), and an aluminum-based metal film (a metal film of about 500 nm thick having aluminum as a main component)

Next, as shown in FIG. 13, a final passivation film 18 such as a polyimide film (for example, a photosensitive polyimide film) is formed, for example, by the method of application and then, the resulting film is processed, for example, by typical lithography to form a source pad opening 14 and the like.

Next, as shown in FIG. 14, a back-surface metal drain electrode 19 (for example, titanium, nickel, gold, and the like from the side close to the back surface) is formed, for example, on the substantially whole surface of the back surface 1*b* of the wafer 1, for example, by sputtering film formation. Then, dicing or the like is performed to separate the wafer into individual chips 2.

4. Description on Modification Examples 1 to 4, in Unit Cell Structure (Source-Island Type Cell Structure), of the Vertical-Channel Type Junction SiC Power FET (Vertical Planar Type Structure) According to the One Embodiment of the Present Application (Mainly, from FIGS. 15 to 18)

This section describes various modification examples of the structure around the channel region (the structure of the P type floating region 5 and therearound) corresponding to FIG. 2 of Section 1. In this section, only portions not described above (mainly, those relating to FIG. 2) will be described in principle.

The following description will be specifically made mainly on the assumption that the device has a source-island structure (from FIG. 3 to FIG. 6). It is needless to say that the example of FIG. 2 in Section 1 and each example in this section can be applied to each gate-island structure (Section 5) substantially as they are. They can also be applied to other examples of the source-island structure (Sub-sections (1) and (2) of Section 5) substantially as they are.

Figure 15:
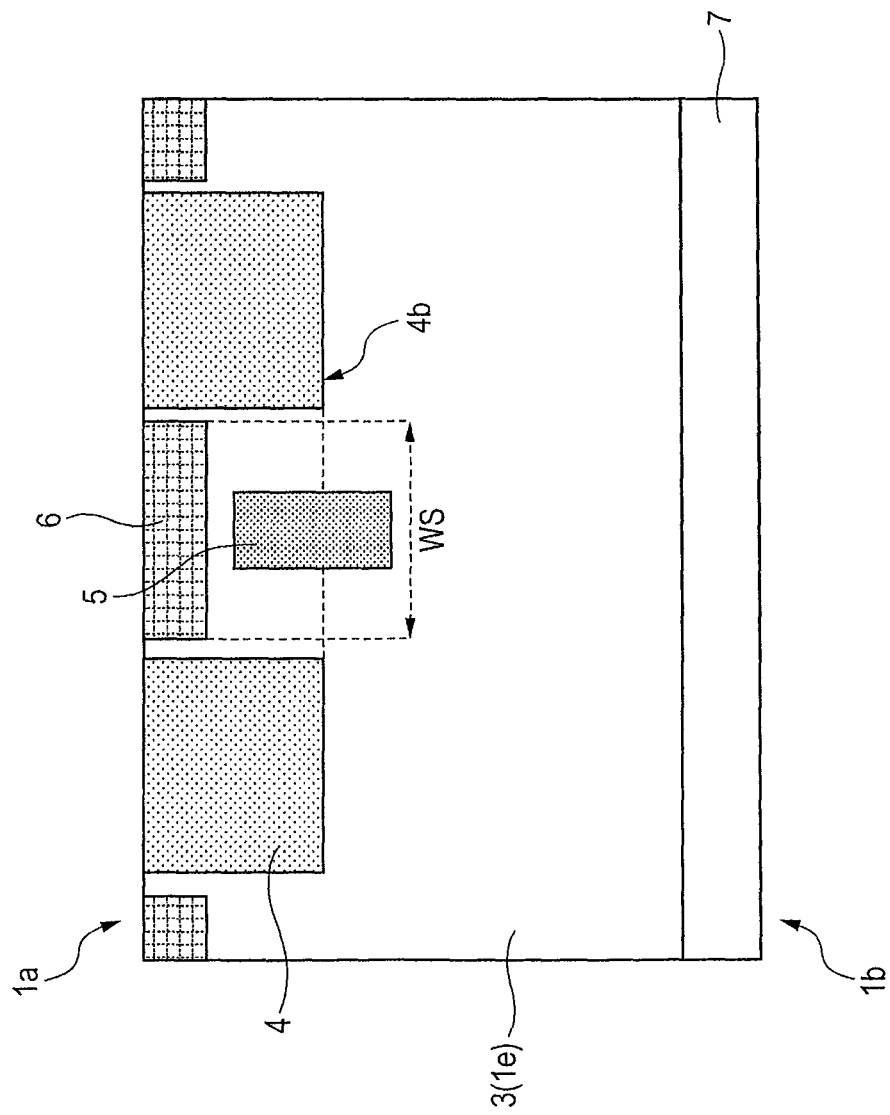
FIG. 15 is a schematic cross-sectional view of a unit cell and regions therearound corresponding to FIG. 2 for describing Modification Example 1 (deep floating gate type source-island system cell structure) relating to the unit cell structure (source-island type cell structure) in the vertical-channel type junction SiC power FET (vertical planar type structure) according to the one embodiment of the present application.
Figure 16:
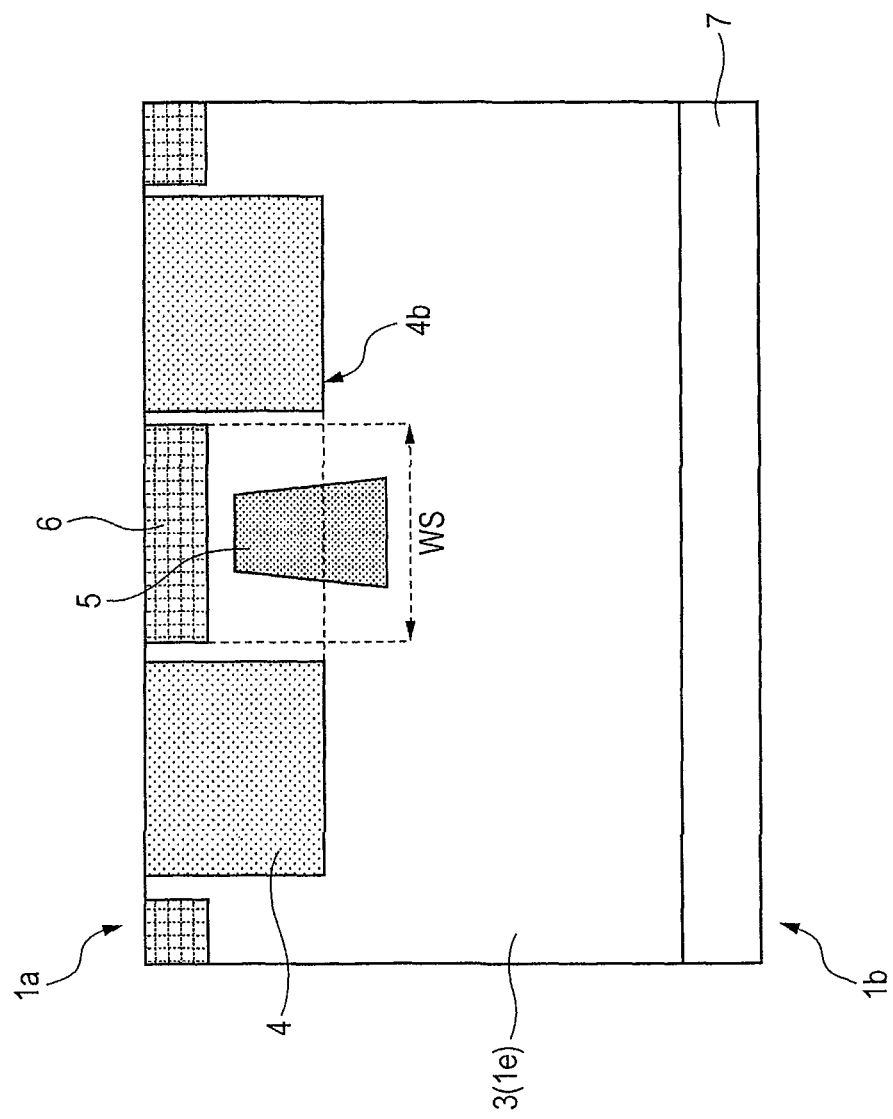
FIG. 16 is a schematic cross-sectional view of a unit cell corresponding to FIG. 2 and regions therearound for describing Modification Example 2 (trapezoidal floating gate type source-island system cell structure) relating to the unit cell structure (source-island type cell structure) in the vertical-channel type junction SiC power FET (vertical planar type structure) according to the one embodiment of the present application.
Figure 17:
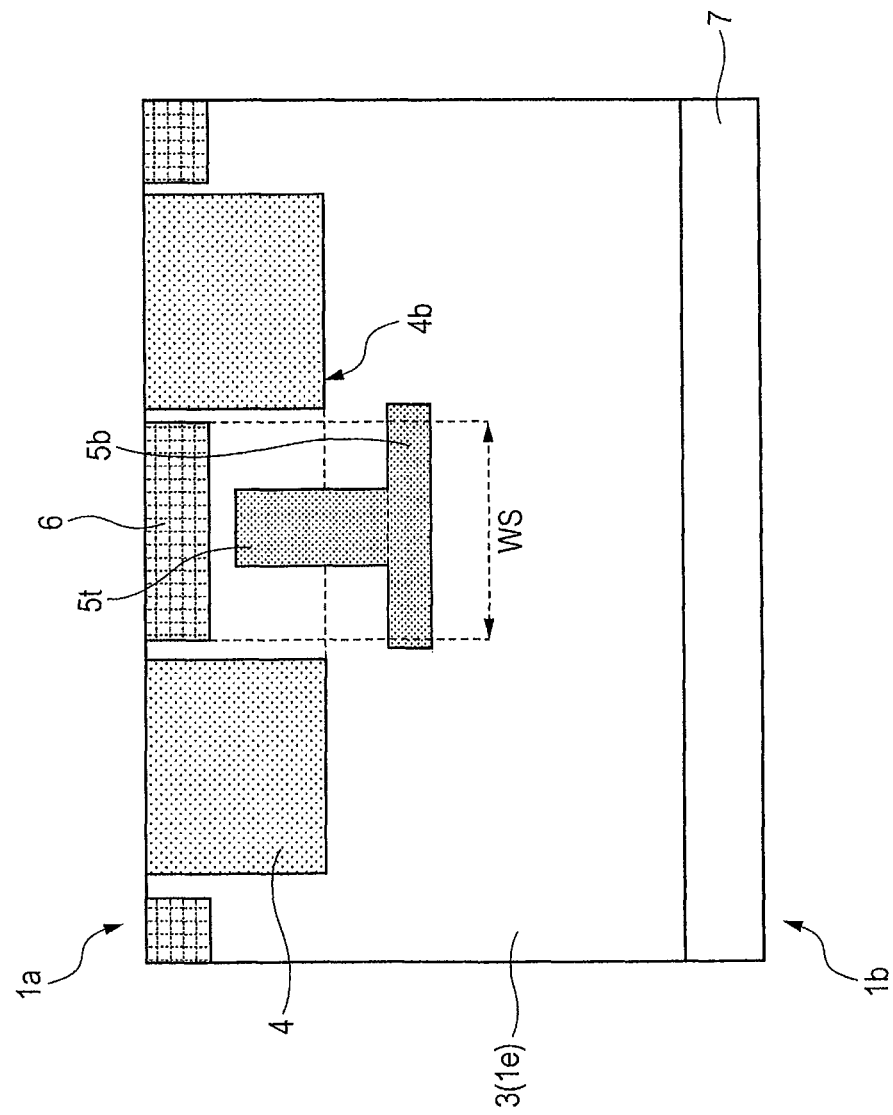
FIG. 17 is a schematic cross-sectional view of a unit cell corresponding to FIG. 2 and regions therearound for describing Modification Example 3 (inverted T-shaped floating gate type source-island system cell structure) relating to the unit cell structure (source-island type cell structure) in the vertical-channel type junction SiC power FET (vertical planar type structure) according to the one embodiment of the present application.
Figure 18:
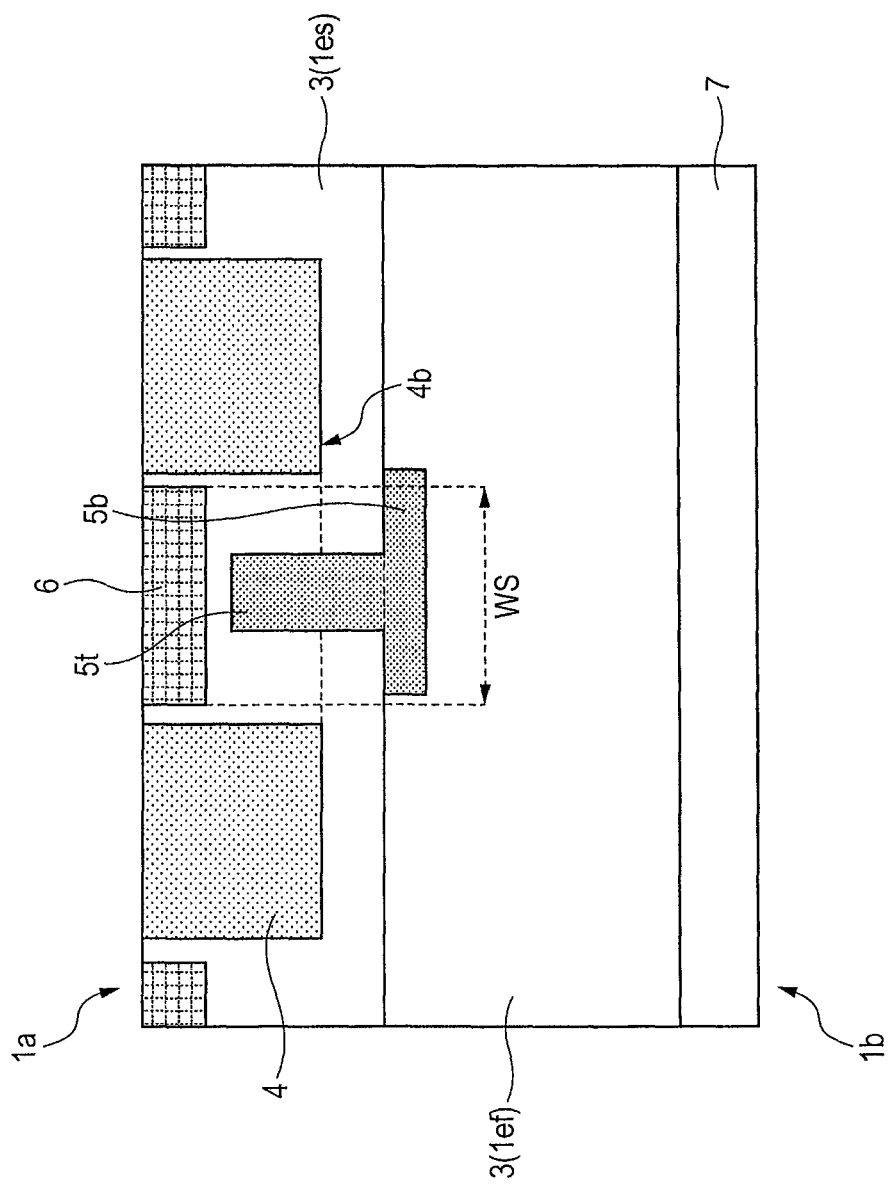
FIG. 18 is a schematic cross-sectional view of a unit cell corresponding to FIG. 2 and regions therearound for describing Modification Example 4 (two-stage epitaxy inverted T-shaped floating gate type source-island system cell structure) relating to the unit cell structure (source-island type cell structure) in the vertical-channel type junction SiC power FET (vertical planar type structure) according to the one embodiment of the present application.

FIG. 15 is a schematic cross-sectional view of a unit cell and regions therearound corresponding to FIG. 2 for describing Modification Example 1 (deep floating gate type source-island system cell structure) relating to the unit cell structure (source-island type cell structure) in the vertical-channel type junction SiC power FET (vertical planar type structure) according to the one embodiment of the present application. FIG. 16 is a schematic cross-sectional view of a unit cell corresponding to FIG. 2 and regions therearound for describing Modification Example 2 (trapezoidal floating gate type source-island system cell structure) relating to the unit cell structure (source-island type cell structure) in the vertical-channel type junction SiC power FET (vertical planar type structure) according to the one embodiment of the present application. FIG. 17 is a schematic cross-sectional view of a unit cell corresponding to FIG. 2 and regions therearound for describing Modification Example 3 (inverted T-shaped floating gate type source-island system cell structure) relating to the unit cell structure (source-island type cell structure) in the vertical-channel type junction SiC power FET (vertical planar type structure) according to the one embodiment of the present application. FIG. 18 is a schematic cross-sectional view of a unit cell corresponding to FIG. 2 and regions therearound for describing Modification Example 4 (two-stage epitaxy inverted T-shaped floating gate type source-island system cell structure) relating to the unit cell structure (source-island type cell structure) in the vertical-channel type junction SiC power FET (vertical planar type structure) according to the one embodiment of the present application. Based on these drawings, Modification Examples 1 to 4, in unit cell structure (source-island cell type structure), of the vertical-channel type junction SiC power FET (vertical planar type structure) according to the one embodiment of the present application will be described.

(1) Deep Floating Gate Type Source-Island System Cell Structure (Mainly, FIG. 15)

An additional characteristic of this example is that as shown in FIG. 15, the lower end of the P type floating region 5 (floating gate region) extends below the lower end 4*b* of the P type gate region 4 (normal gate region). Even if there appears a difference in height between the lower end of the P type floating region 5 (floating gate region) and the lower end 4*b* of the P type gate region 4 (normal gate region) due to process variations, a sufficiently effective channel length can be secured. On the other hand, the example of FIG. 2 has the advantage that the ion implantation step of the P type floating region 5 can be performed easily at relatively low energies.

(2) Trapezoidal Floating Gate Type Source-Island System Cell Structure (Mainly, FIG. 16)

An additional characteristic of this example is that as shown in FIG. 16, the width of the lower end of the P type floating region 5 (floating gate region) is wider than that of the upper end and this floating region has a trapezoidal cross-section. Such a shape makes it possible to obtain an effect analogous to that of a lateral channel type. The ion implantation step of this P type floating region 5 becomes a little more complex. Described specifically, this trapezoidal floating region is obtained, for example, by performing multistage ion implantation while setting the width of the opening of an ion implantation mask wider in a lower stage or while using masks of the same width and implanting at a vertical implantation angle in an upper stage and at an inclined angle in a lower stage.

(3) Inverted T-Shaped Floating Gate Type Source-Island System Cell Structure (Mainly, FIG. 17):

In this example, as shown in FIG. 17, the P type floating region 5 (floating gate region) of FIG. 15 is divided into two portions, that is, an upper P type floating region 5*t* and a lower P type floating region 5*b*. In other words, the P type floating region 5 of FIG. 15 (the upper P type floating region 5*t* in FIG. 17) has, at the lower end thereof, the lower P type floating region 5*b*. When such a structure is employed, the channel portion has at the lower end thereof a lateral channel so that an advantage similar to that of a lateral channel can be obtained as a secondary advantage. On the other hand, this example has the disadvantage that ion implantation at high energies is necessary for the formation of the lower P type floating region 5*b*.

(4) Two-Stage Epitaxy Inverted T-Shaped Floating Gate Type Source-Island System Cell Structure (Mainly, FIG. 18)

In order to avoid the disadvantage of the example shown in FIG. 17, this example is formed, as shown in FIG. 18, by forming an N− type SiC lower epitaxy layer 1*ef*, introducing therein a lower P type floating region 5*b* by ion implantation or the like, forming an N− type SiC upper epitaxy layer 1*es*, and then forming an upper P type floating region 5*t* (the P type floating region of FIG. 15) in a manner similar to that of the example of FIG. 15.

By forming the floating region as described above, a structure similar to that of FIG. 17 can be obtained without ion implantation at relatively high energies. On the other hand, this epitaxial process has the advantage that it is performed in two stages.

5. Description on Modification Examples 1 and 2 (Source-Island Type Cell Structure) and Modification Examples 3 to 5 (Gate-Island Type Cell Structure), in Overall Layout of a Chip, of the Vertical-Channel Type Junction SiC Power FET (Vertical Planar Type Structure) According to the One Embodiment of the Present Application (Mainly, FIGS. 19 to 34)

This section describes modification examples mainly in a planar layout (layout of the active cell region 9 and regions therearound) described in Section 2 referring to FIGS. 3 to 6. Only points not described above will hereinafter be described in principle.

Examples of Sub-sections (1) and (2) belong to, similar to the examples of FIGS. 3 to 6, a source-island type cell structure, while examples of Sub-sections (3), (4), and (5) belong to a gate-island type cell structure. The source-island type cell structure has the advantage that even in a single-layer metal structure, it facilitates arrangement of a wide source electrode at the center. The gate-island type cell structure, on the other hand, has the advantage that leading of a gate and leading of a source can be made in a substantially symmetrical form.

Figure 28:
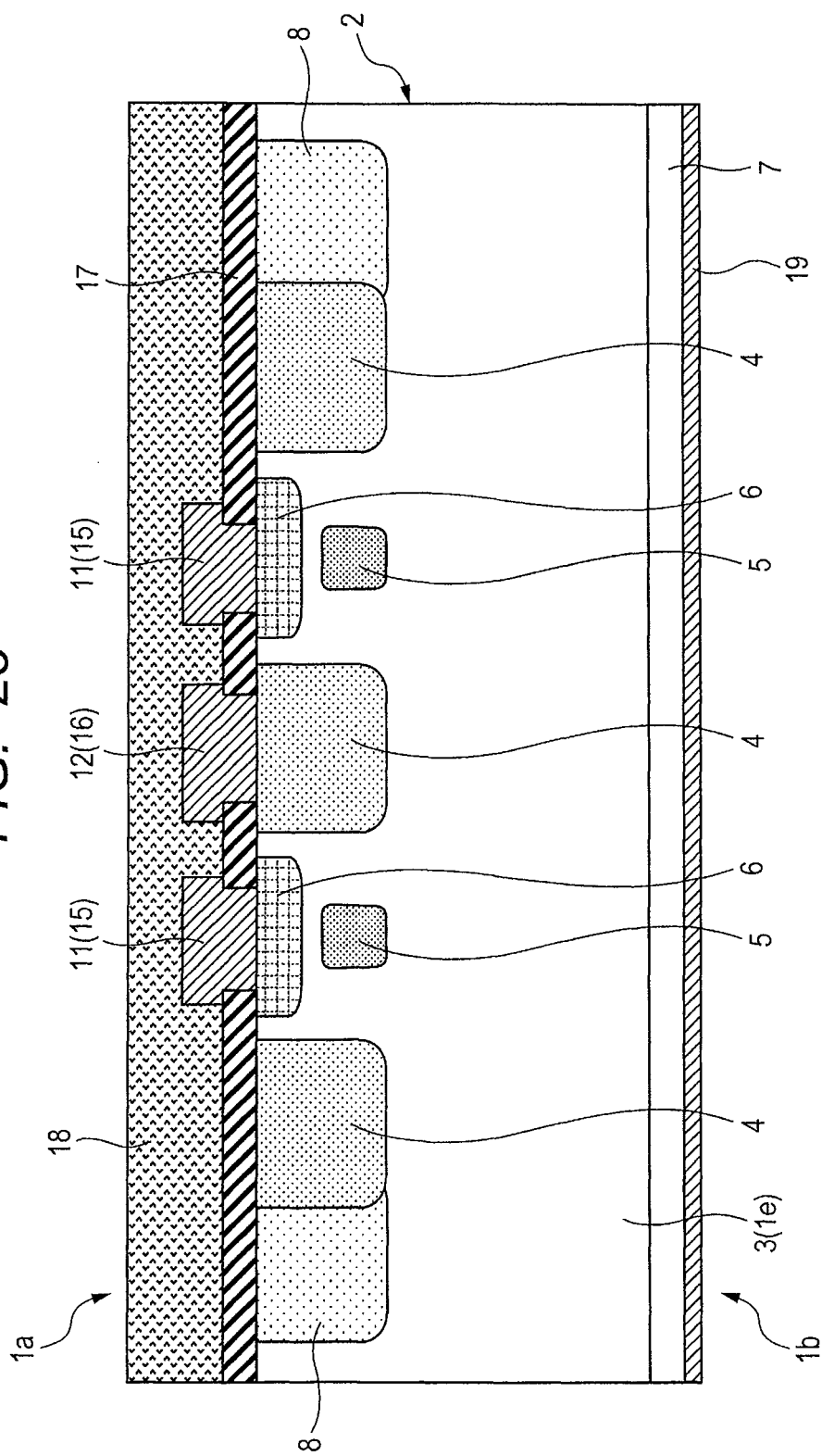
FIG. 28 is a device cross-sectional view corresponding to the B-C cross-section of FIG. 25.

The B-C cross-section in Sub-sections (1) and (2) are fundamentally similar to that described in FIG. 6, while the B-C cross-section in Sub-sections (3) to (5) are fundamentally similar to that described in FIG. 28. In each example, an overlapping description is omitted in principle.

Figure 19:
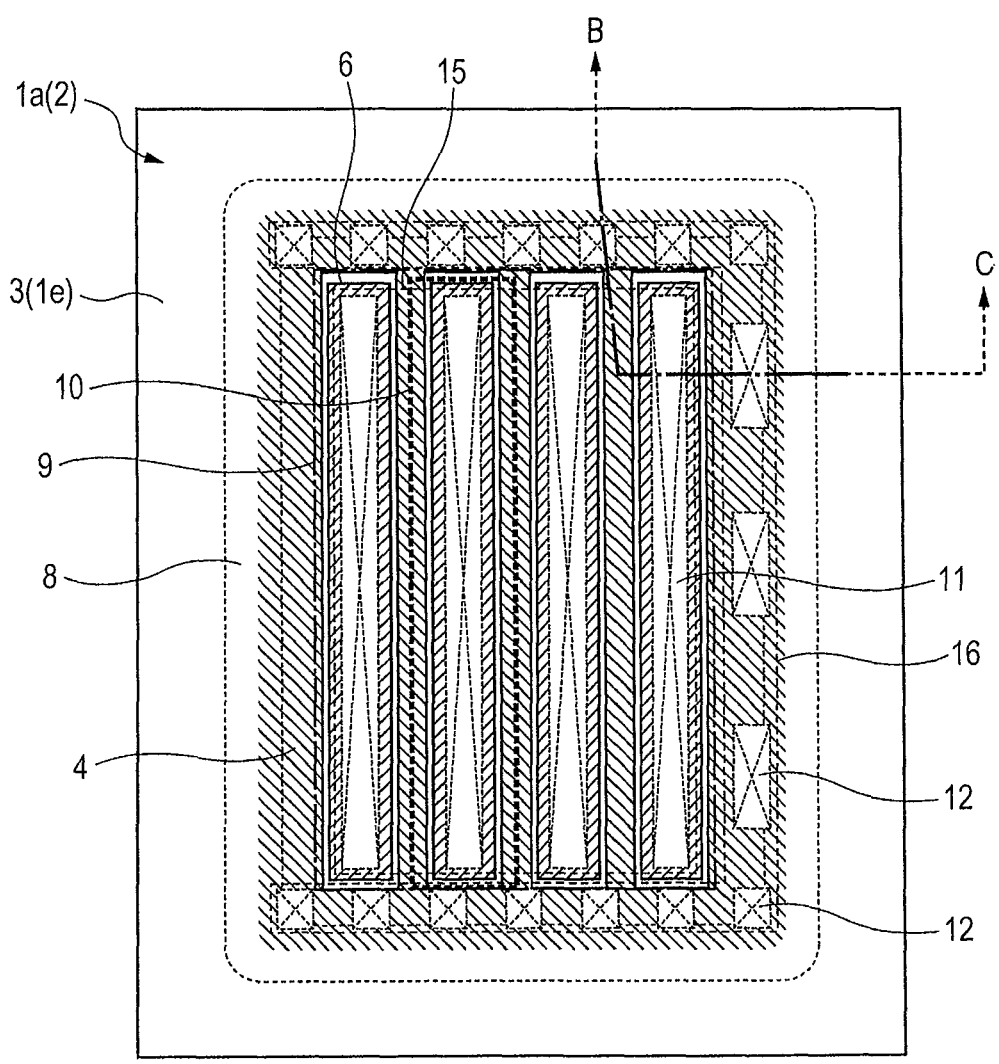
FIG. 19 is an overall top view (including an upper surface metal structure) of a chip corresponding to FIG. 3 for describing Modification Example 1 (stripe type source-island system cell structure) relating to the overall chip layout in the vertical-channel type junction SiC power FET (vertical planar type structure) according to the one embodiment of the present application.
Figure 20:
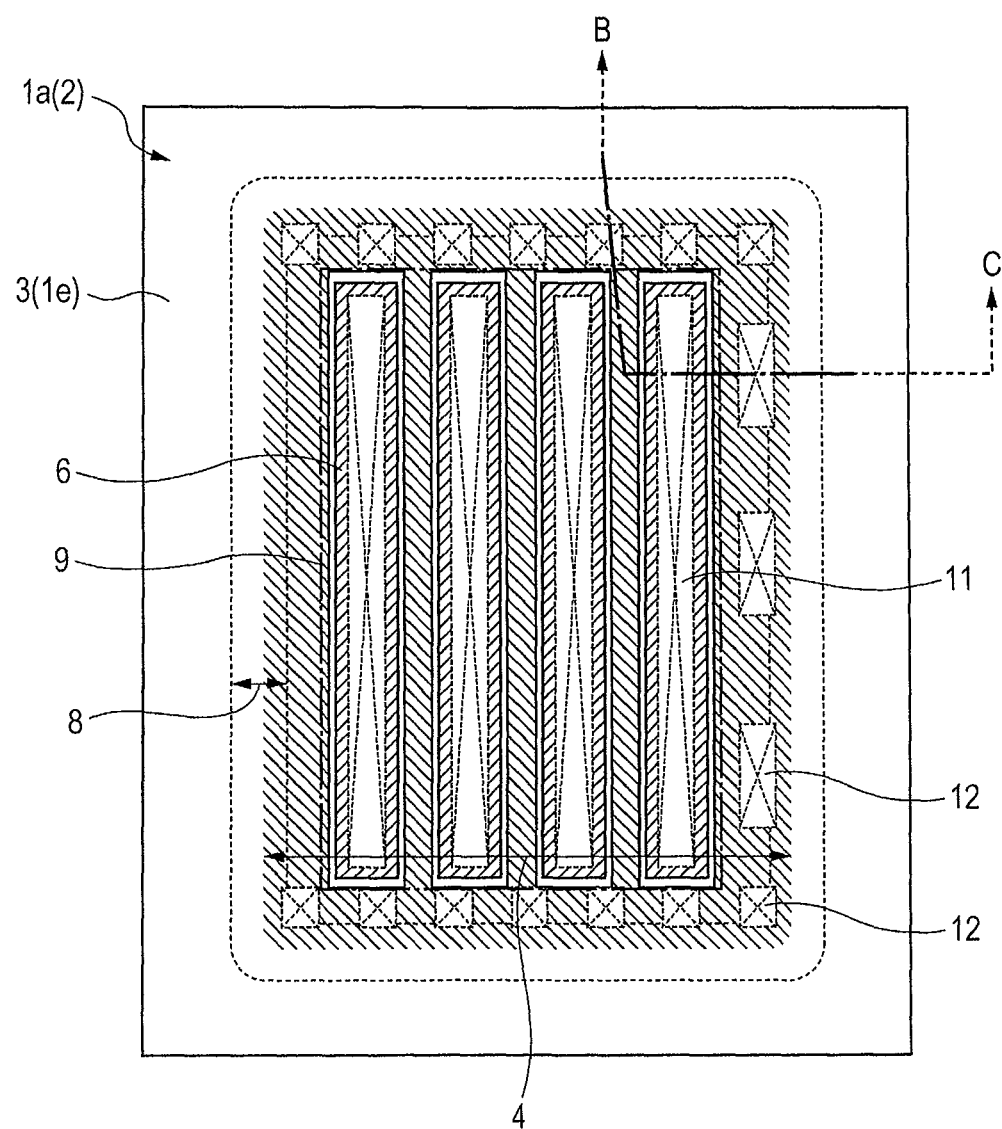
FIG. 20 is an overall top view (having an emphasized contact portion while removing the upper surface metal structure) of a chip corresponding to FIG. 19.
Figure 21:
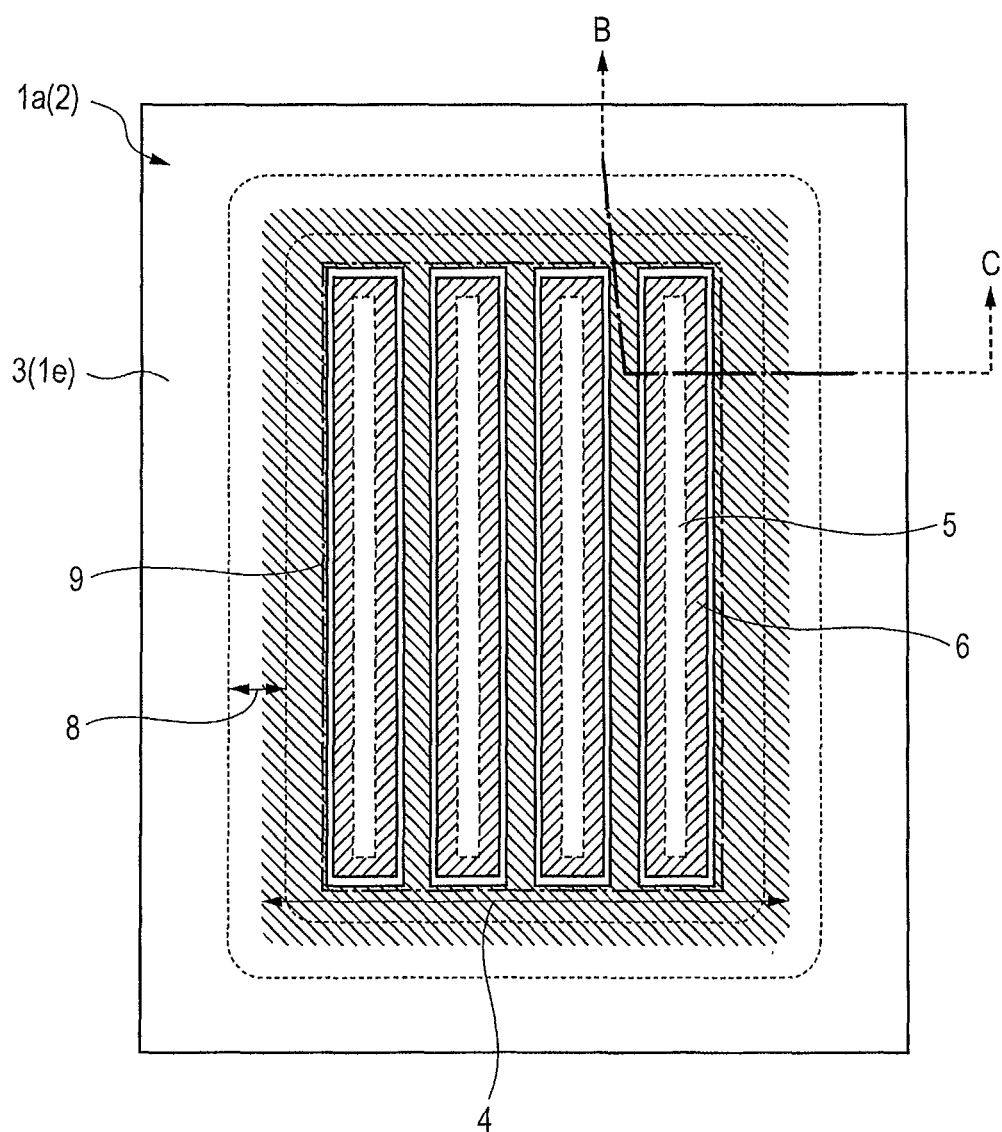
FIG. 21 is an overall top view (having an emphasized impurity region while removing the upper surface metal structure) of a chip corresponding to FIG. 19.
Figure 22:
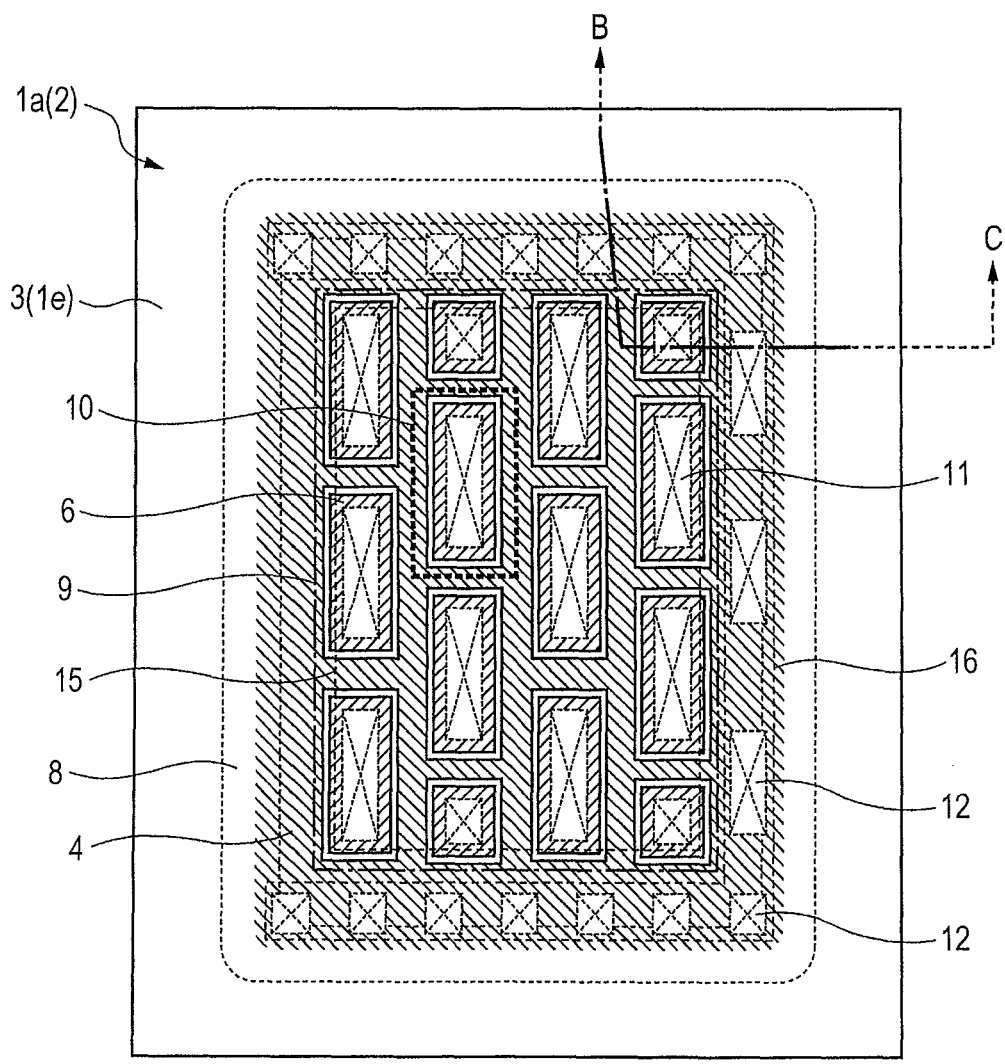
FIG. 22 is an overall top view (including an upper surface metal structure) of a chip corresponding to FIG. 4 for describing Modification Example 2 (oblique lattice type source-island system cell structure) relating to the overall chip layout in the vertical-channel type junction SiC power FET (vertical planar type structure) according to the one embodiment of the present application.
Figure 23:
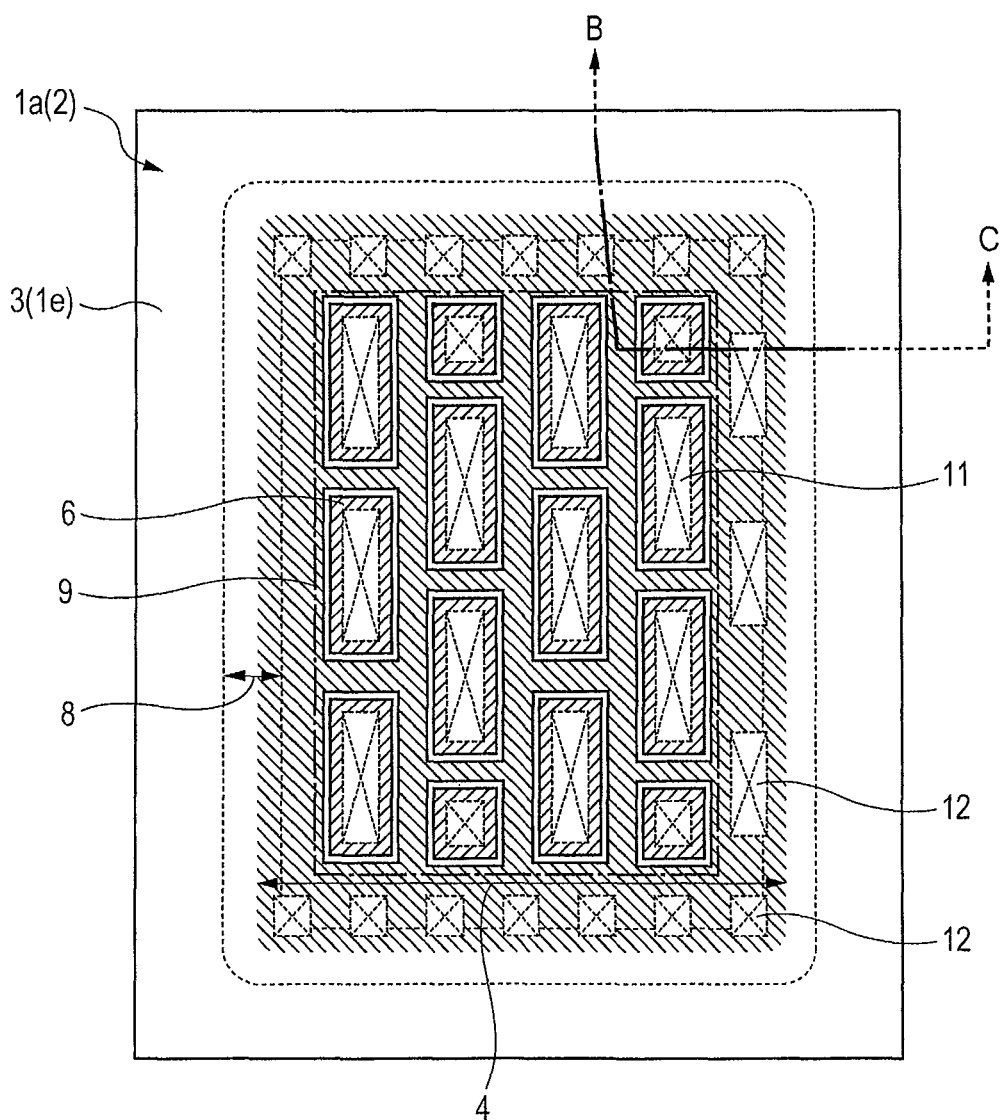
FIG. 23 is an overall top view (having an emphasized contact portion while removing the upper surface metal structure) of a chip corresponding to FIG. 22.
Figure 24:
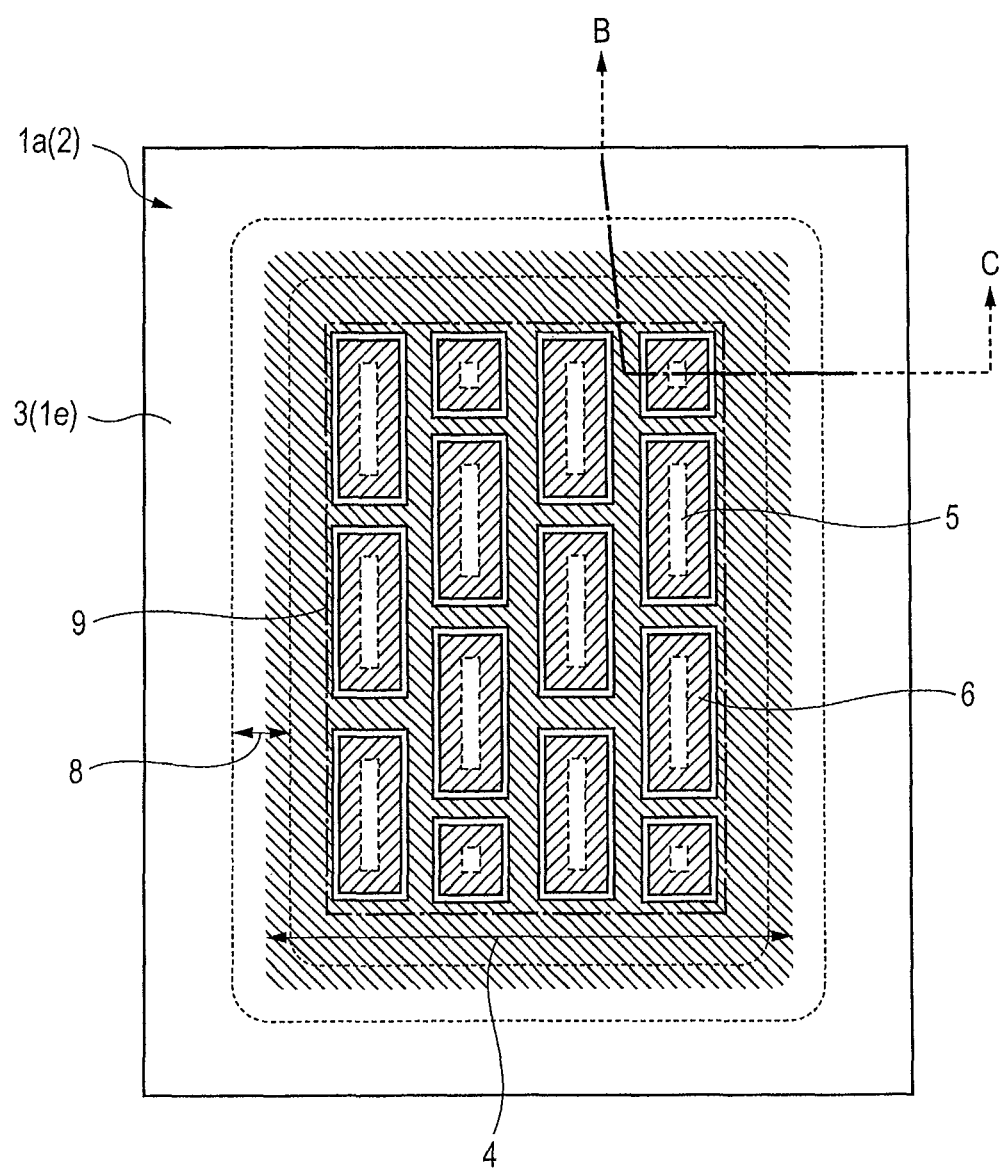
FIG. 24 is an overall top view (having an emphasized impurity region while removing the upper surface metal structure) of a chip corresponding to FIG. 22.
Figure 25:
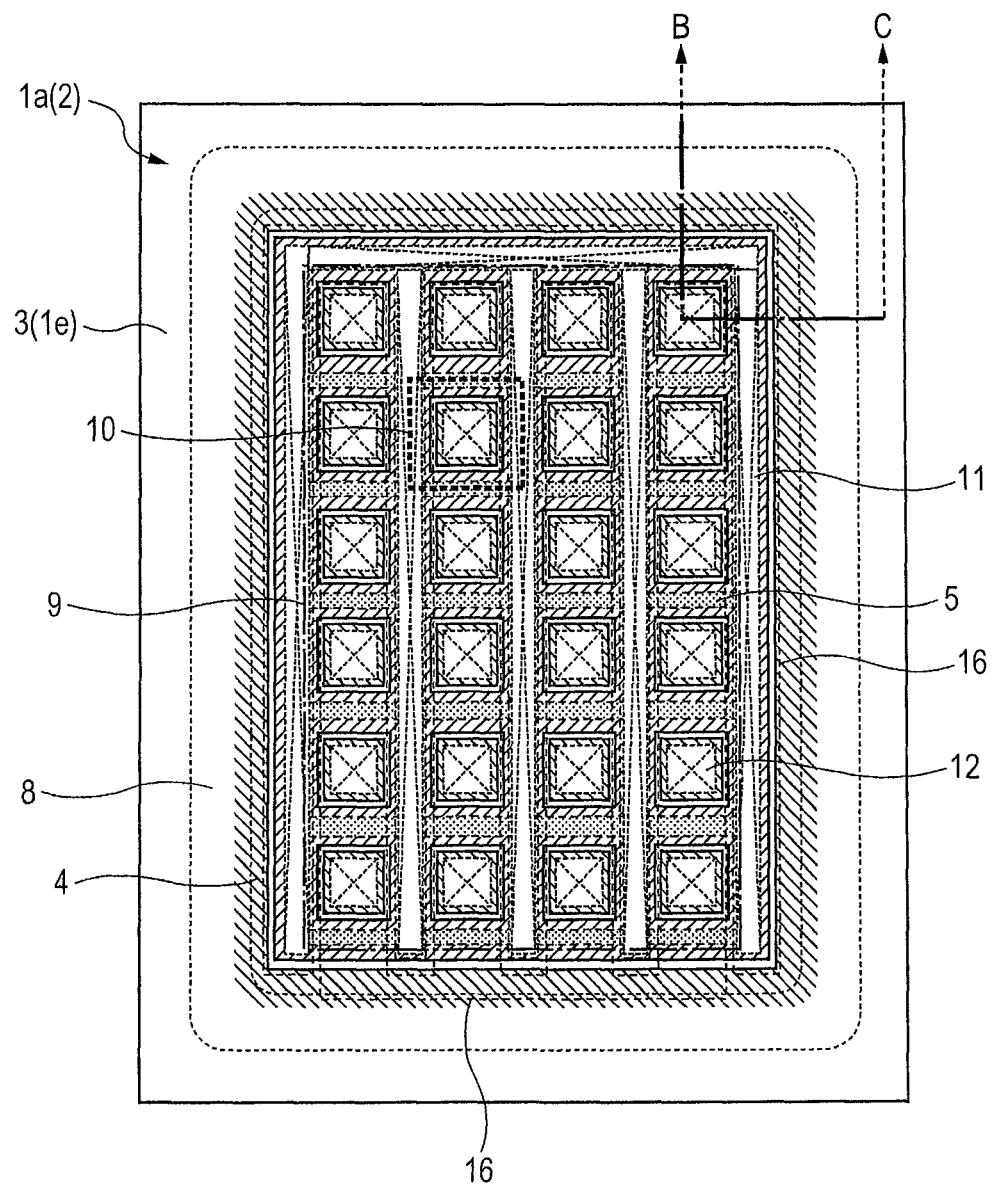
FIG. 25 is an overall top view (including an upper surface metal structure) of a chip corresponding to FIG. 3 for describing Modification Example 3 (square lattice type gate-island system cell structure) relating to the overall chip layout in the vertical-channel type junction SiC power FET (vertical planar type structure) according to the one embodiment of the present application.
Figure 26:
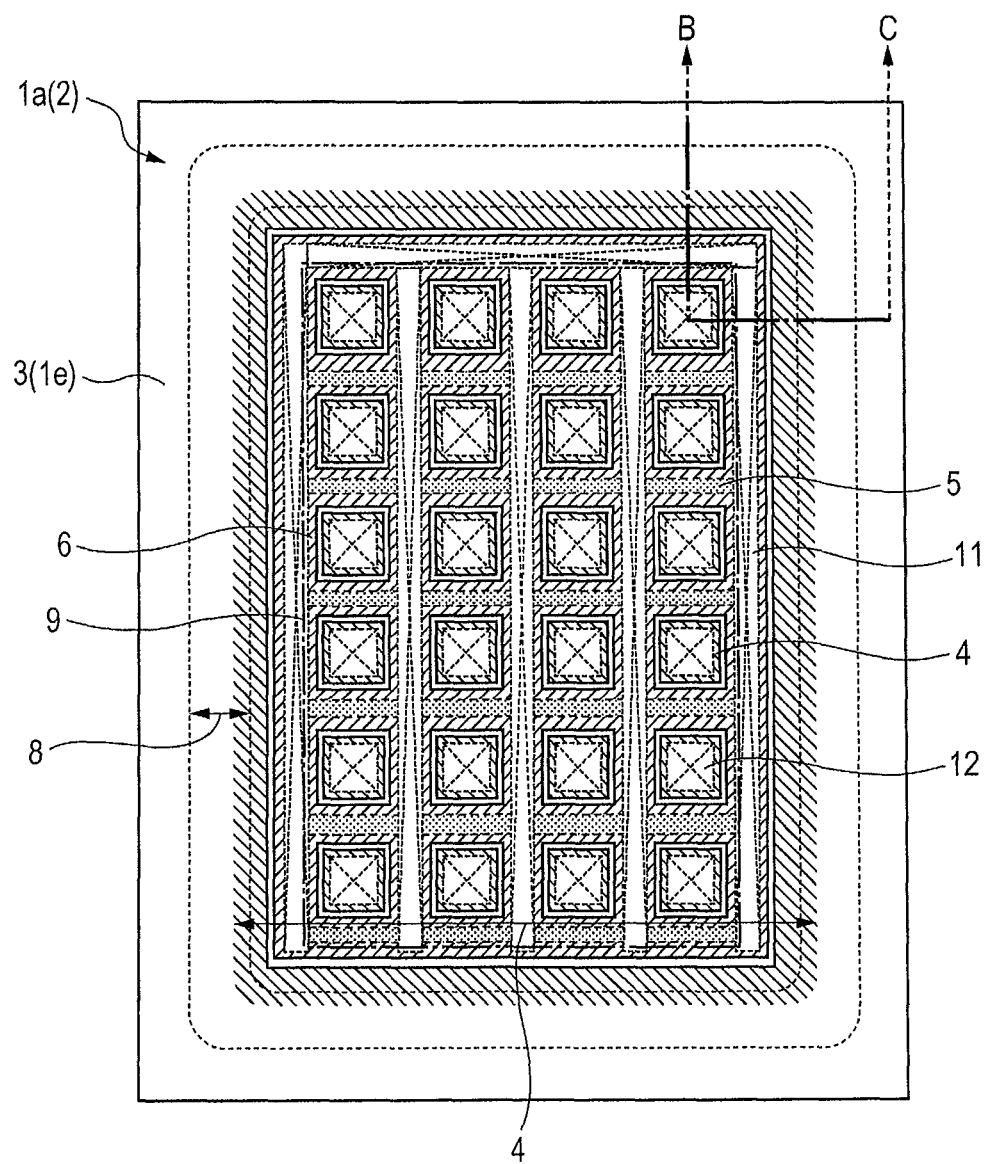
FIG. 26 is an overall top view (having an emphasized contact portion while removing the upper surface metal structure) of a chip corresponding to FIG. 25.
Figure 27:
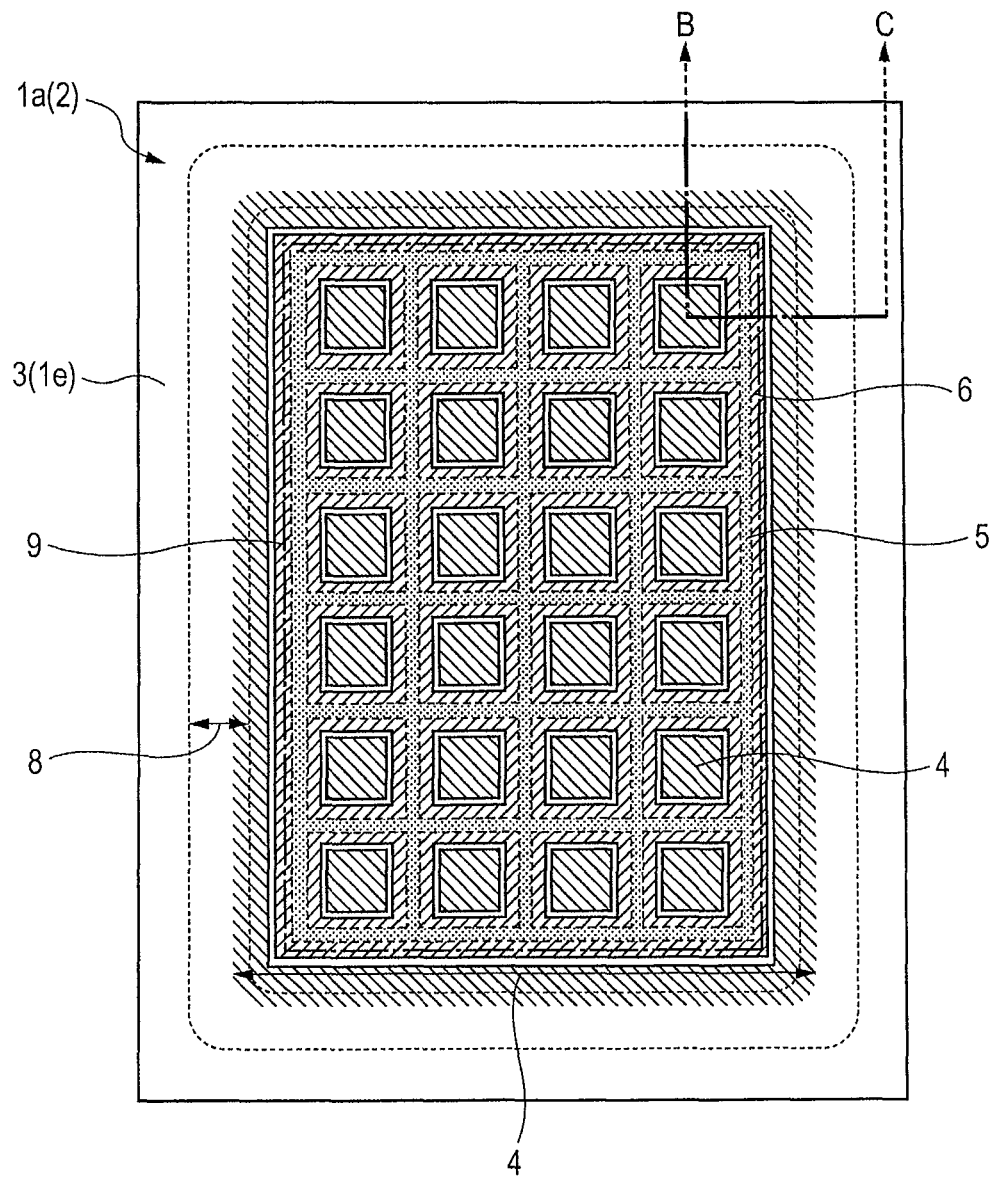
FIG. 27 is an overall top view (having an emphasized impurity region while removing the upper surface metal structure) of a chip corresponding to FIG. 25.
Figure 29:
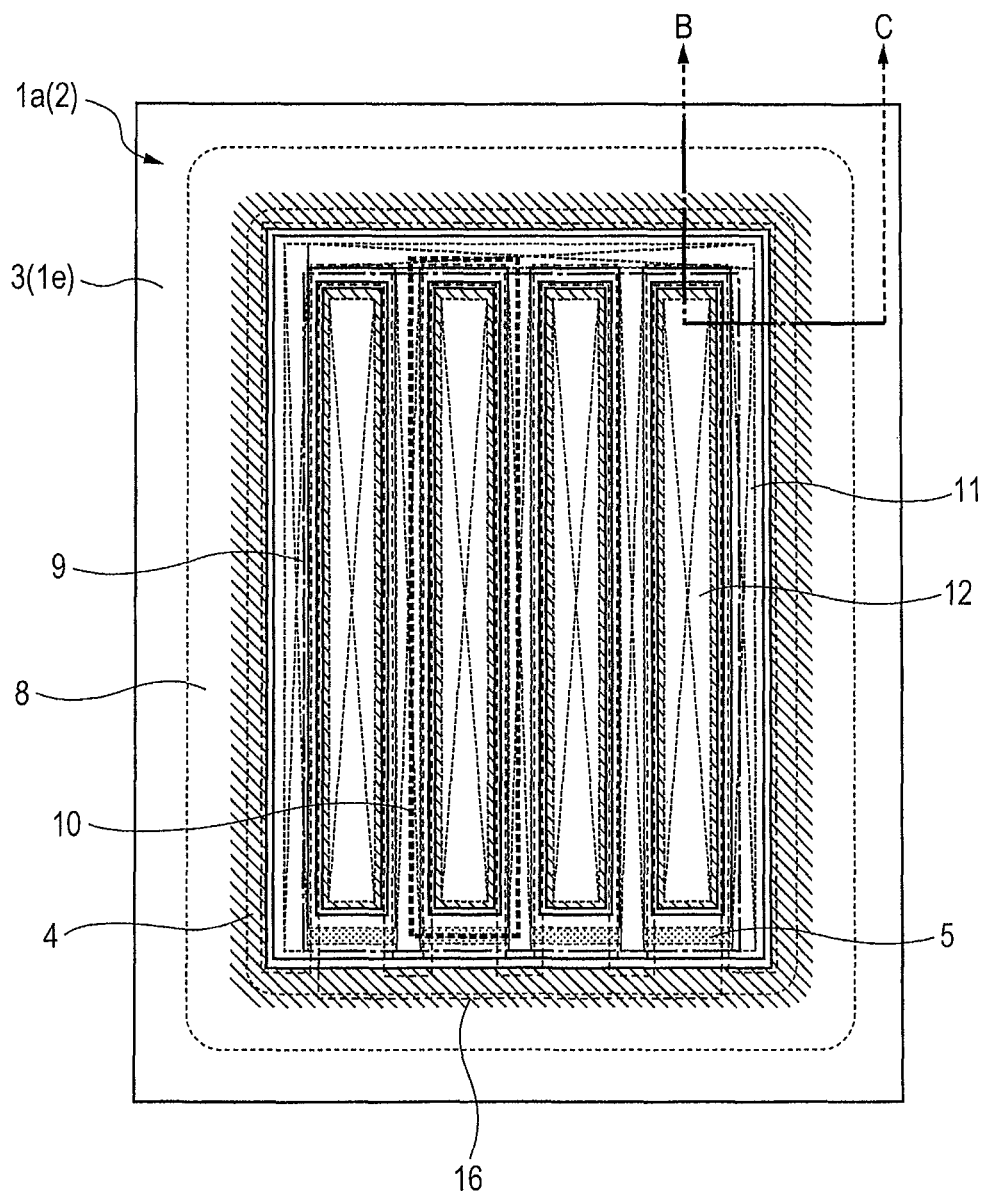
FIG. 29 is an overall top view (including an upper surface metal structure) of a chip corresponding to FIG. 3 for describing Modification Example 4 (stripe type gate-island system cell structure) relating to the overall chip layout in the vertical-channel type junction SiC power FET (vertical planar type structure) according to the one embodiment of the present application.
Figure 30:
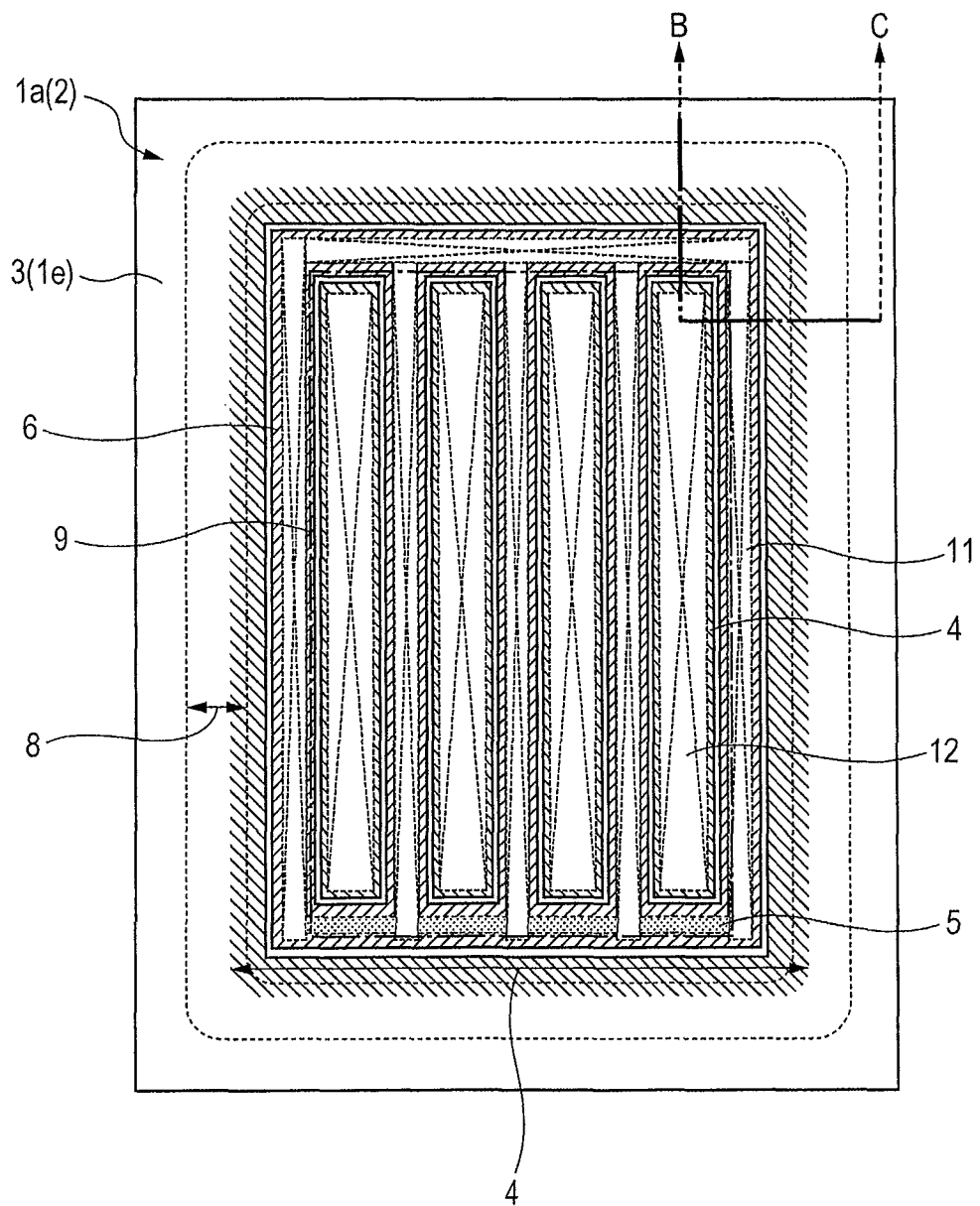
FIG. 30 is an overall top view (having an emphasized contact portion while removing the upper surface metal structure) of a chip corresponding to FIG. 29.
Figure 31:
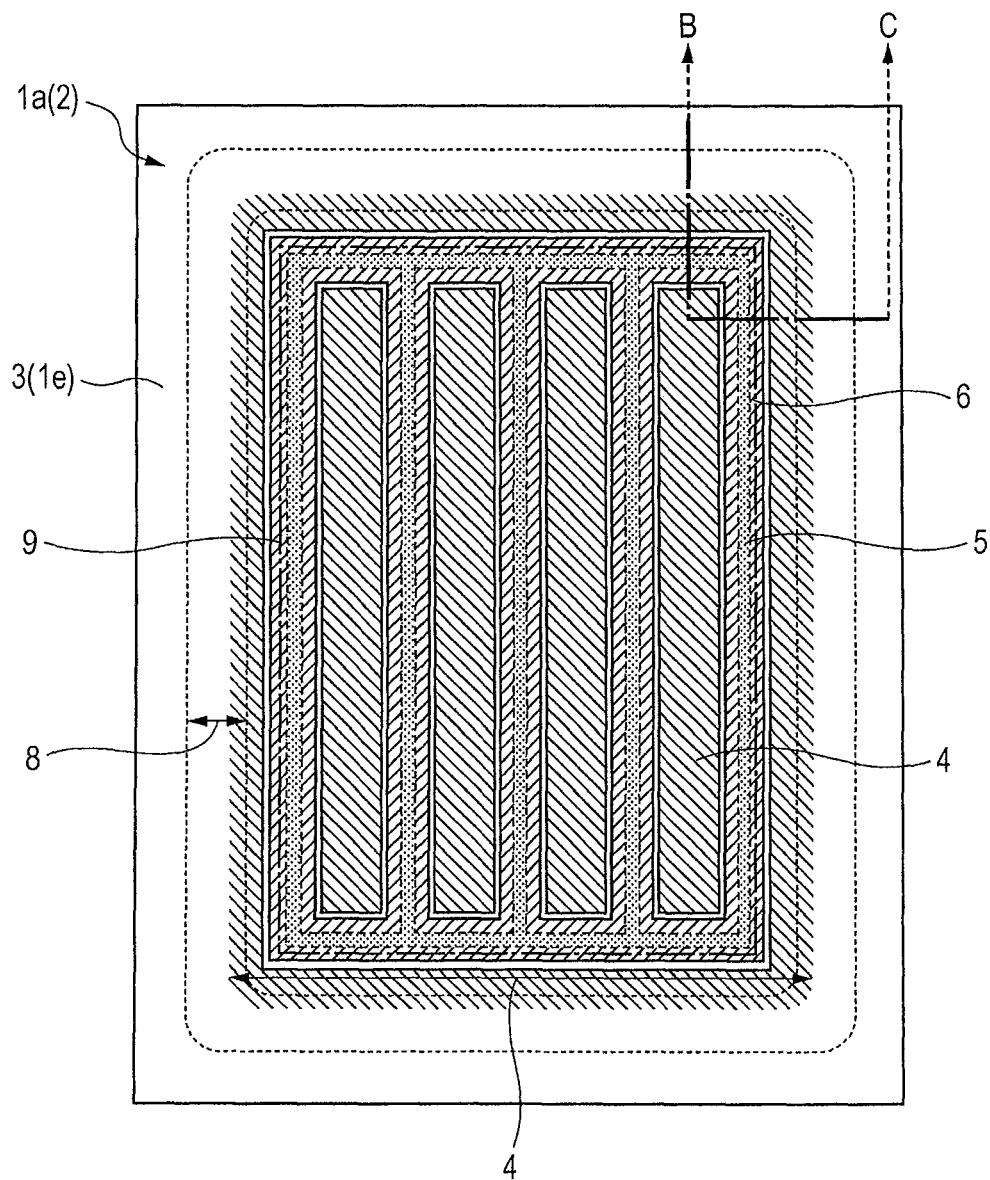
FIG. 31 is an overall top view (having an emphasized impurity region while removing the upper surface metal structure) of a chip corresponding to FIG. 29.
Figure 32:
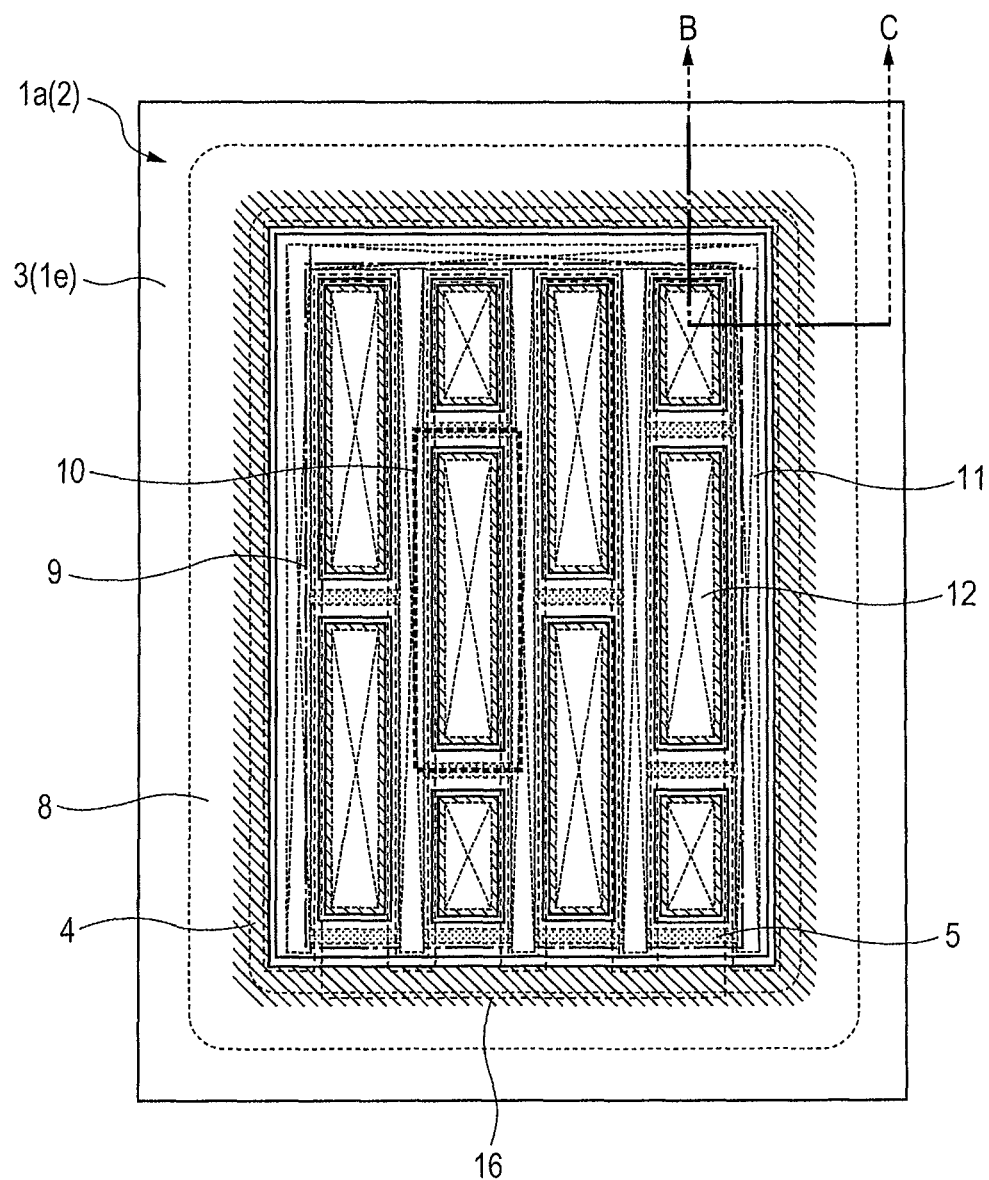
FIG. 32 is an overall top view (including an upper surface metal structure) of a chip corresponding to FIG. 3 for describing Modification Example 5 (deformed oblique lattice type gate-island system cell structure) relating to the overall chip layout in the vertical-channel type junction SiC power FET (vertical planar type structure) according to the one embodiment of the present application.
Figure 33:
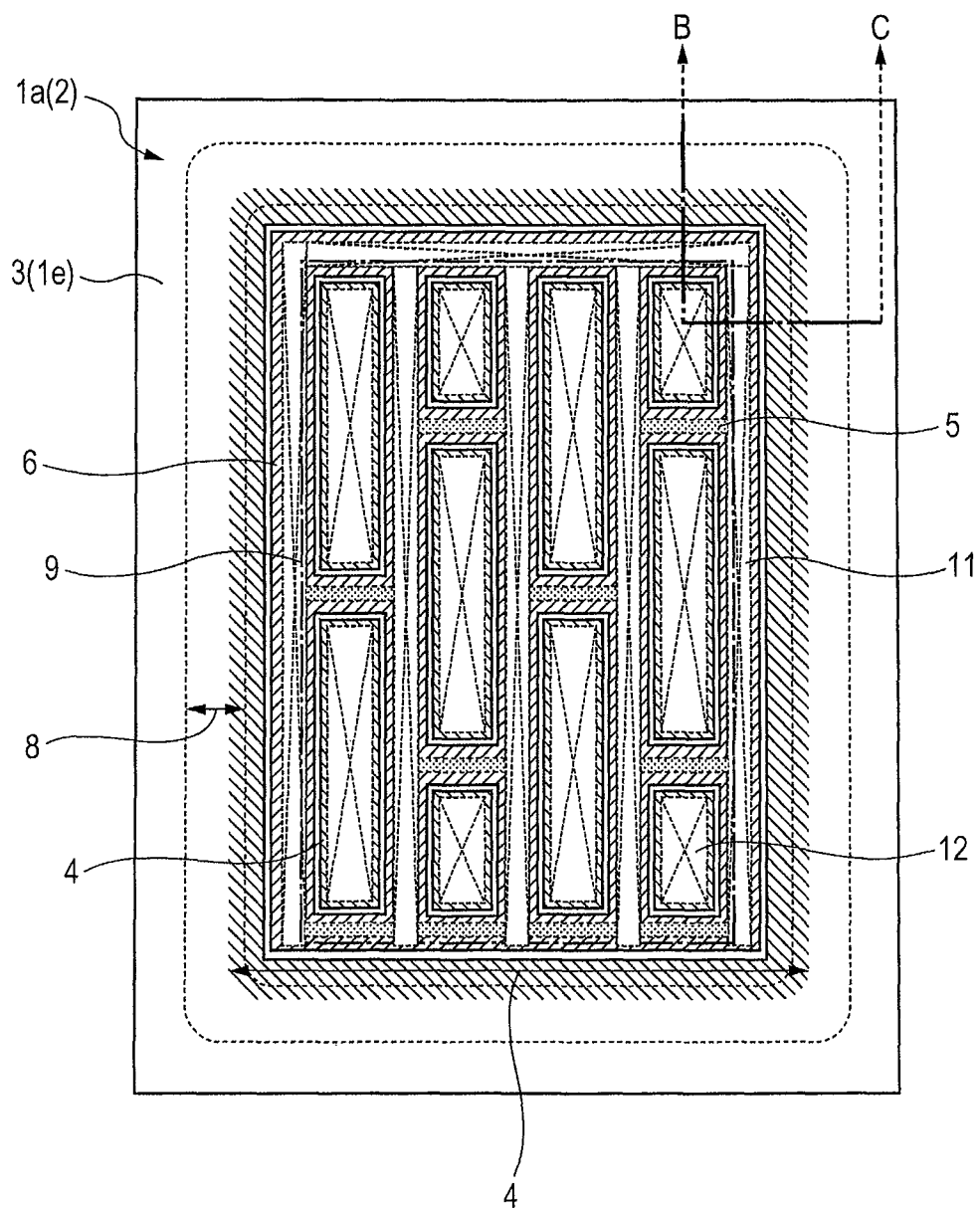
FIG. 33 is an overall top view (having an emphasized contact portion while removing the upper surface metal structure) of a chip corresponding to FIG. 32.
Figure 34:
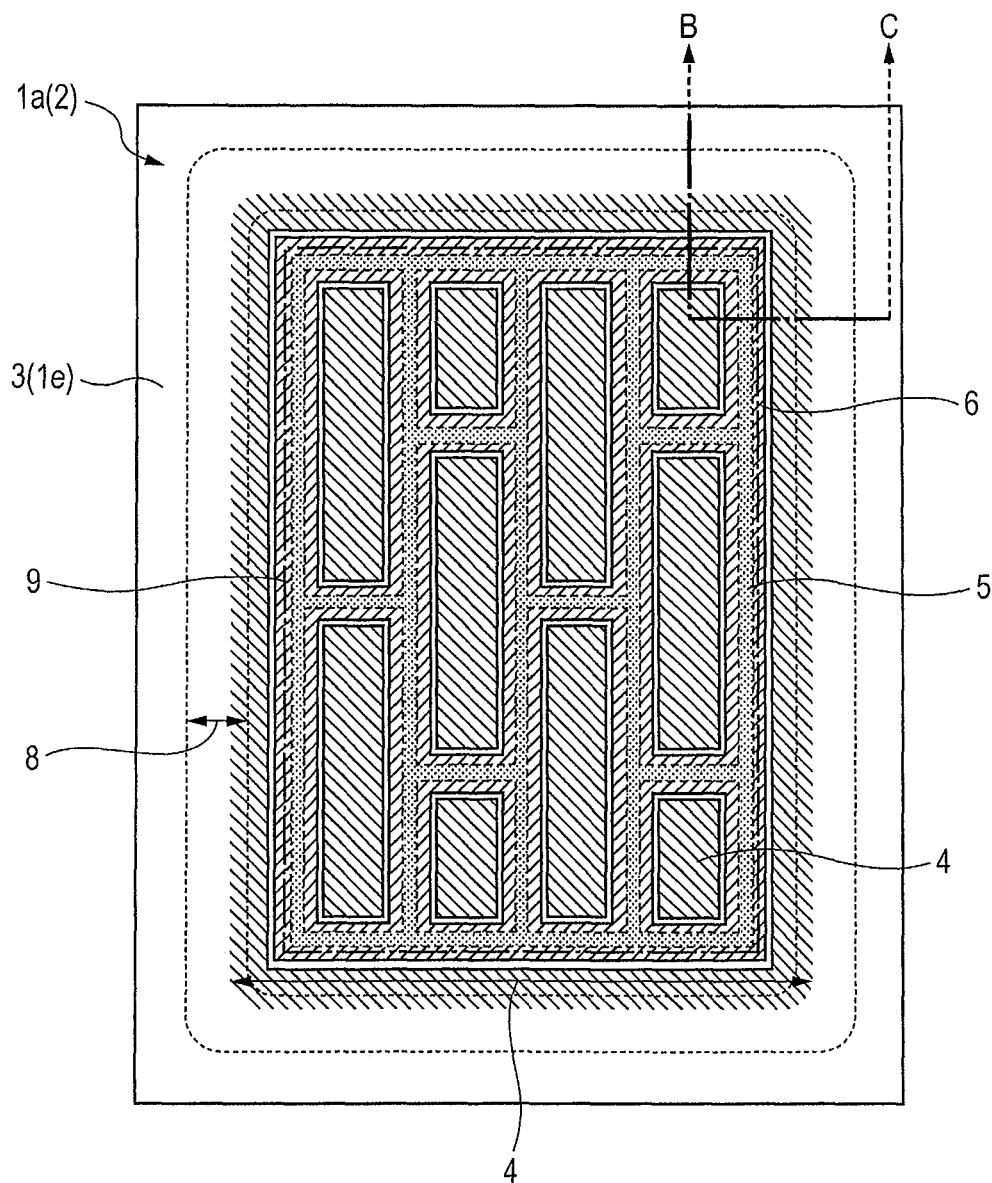
FIG. 34 is an overall top view (having an emphasized impurity region while removing the upper surface metal structure) of a chip corresponding to FIG. 32.

FIG. 19 is an overall top view (including an upper surface metal structure) of a chip corresponding to FIG. 3 for describing Modification Example 1 (stripe type source-island system cell structure) relating to the overall chip layout in the vertical-channel type junction SiC power FET (vertical planar type structure) according to the one embodiment of the present application. FIG. 20 is an overall top view (having an emphasized contact portion while removing the upper surface metal structure) of a chip corresponding to FIG. 19. FIG. 21 is an overall top view (having an emphasized impurity region while removing the upper surface metal structure) of a chip corresponding to FIG. 19. FIG. 22 is an overall top view (including an upper surface metal structure) of a chip corresponding to FIG. 4 for describing Modification Example 2 (oblique lattice type source-island system cell structure) relating to the overall chip layout in the vertical-channel type junction SiC power FET (vertical planar type structure) according to the one embodiment of the present application. FIG. 23 is an overall top view (having an emphasized contact portion while removing the upper surface metal structure) of a chip corresponding to FIG. 22. FIG. 24 is an overall top view (having an emphasized impurity region while removing the upper surface metal structure) of a chip corresponding to FIG. 22. FIG. 25 is an overall top view (including an upper surface metal structure) of a chip corresponding to FIG. 3 for describing Modification Example 3 (square lattice type gate-island system cell structure) relating to the overall chip layout in the vertical-channel type junction SiC power FET (vertical planar type structure) according to the one embodiment of the present application. FIG. 26 is an overall top view (having an emphasized contact portion while removing the upper surface metal structure) of a chip corresponding to FIG. 25. FIG. 27 is an overall top view (having an emphasized impurity region while removing the upper surface metal structure) of a chip corresponding to FIG. 25. FIG. 28 is a device cross-sectional view corresponding to the B-C cross-section of FIG. 25. FIG. 29 is an overall top view (including an upper surface metal structure) of a chip corresponding to FIG. 3 for describing Modification Example 4 (stripe type gate-island system cell structure) relating to the overall chip layout in the vertical-channel type junction SiC power FET (vertical planar type structure) according to the one embodiment of the present application. FIG. 30 is an overall top view (having an emphasized contact portion while removing the upper surface metal structure) of a chip corresponding to FIG. 29. FIG. 31 is an overall top view (having an emphasized impurity region while removing the upper surface metal structure) of a chip corresponding to FIG. 29. FIG. 32 is an overall top view (including an upper surface metal structure) of a chip corresponding to FIG. 3 for describing Modification Example 5 (deformed oblique lattice type gate-island system cell structure) relating to the overall chip layout in the vertical-channel type junction SiC power FET (vertical planar type structure) according to the one embodiment of the present application. FIG. 33 is an overall top view (having an emphasized contact portion while removing the upper surface metal structure) of a chip corresponding to FIG. 32. FIG. 34 is an overall top view (having an emphasized impurity region while removing the upper surface metal structure) of a chip corresponding to FIG. 32. Based on these drawings, Modification Examples 1 and 2 (source-island type cell structure) and Modification Examples 3 to 5 (gate-island type cell structure) relating to the overall chip layout in the vertical-channel type junction SiC power FET (vertical planar type structure) according to the one embodiment of the present application will next be described.

(1) Stripe-Type (Modification Example 1) Source-Island System Cell Layout (Mainly, from FIG. 19 to FIG. 21)

As is apparent from FIG. 19 to FIG. 21, this example is basically similar to that of from FIG. 3 to FIG. 6 and is characterized in that the unit cell region 10 runs longitudinally through the active cell region 9. In this example, therefore, the P type gate regions 4 (normal gate regions) are arranged in a substantially stripe form in the active cell region 9 and they are linked with each other at the end portion of the active cell region 9. The lead-out of the gate can therefore be comprised of the metal gate wiring 16 provided around the active cell region 9. The metal source electrode 15 can therefore be laid out widely at the center portion.

(2) Oblique Lattice Type (Modification Example 2) Source-Island System Unit Cell Layout (Mainly from FIG. 22 to FIG. 24)

As is apparent from FIG. 22 to FIG. 25, this example is basically similar to that of from FIG. 3 to FIG. 6 and it is characterized in that when two columns adjacent to each other are compared, their unit cell regions 10 are displaced obliquely to form an oblique lattice. The planar distribution of the channel regions can therefore be made relatively uniform. Similar to the above example, the lead-out of the gate can therefore be comprised of the metal gate wiring 16 provided around the active cell region 9. The metal source electrode 15 can therefore be laid out widely at the center portion.

(3) Square Lattice Type (Modification Example 3) Gate-Island System Unit Cell Layout (Mainly from FIG. 25 to FIG. 28)

In the source-island structure (from FIG. 3 to FIG. 5), the N+ source regions 6 are arranged at the lattice points on the island in the active cell region 9. In this example, on the other hand, as is apparent from FIG. 25 to FIG. 28, the P type gate regions 4 (normal gate regions) are arranged at the lattice points of the square lattice or orthogonal lattice. In this example, therefore, in a single layer metal structure, the gate regions 4 are each led outside the active cell region 9 by a comb-shaped metal gate wiring 16.

In this layout, contrary to the source-island structure, the P type floating regions 5 (floating gate regions) are in a mesh form in a planar view (FIG. 27).

Further, this structure enables relative increase in the effective channel width.

Next, the B-C cross-section of from FIG. 25 to FIG. 27 is shown in FIG. 28 (corresponding to FIG. 6). As is apparent from FIG. 6, a semiconductor substrate 2 has, in the surface region on the side of a back surface 1b (second main surface) thereof, an N+ type drain region 7 having, for example, a uniform thickness. The semiconductor substrate 2 has, on a back surface 1b thereof, a back-surface metal electrode film 19 (metal drain electrode film).

On the other hand, the semiconductor substrate 2 has, from the surface to the inside thereof on the side of the surface 1a (first main surface), has, in this example, an N− type drift region 3 (for example, N− type SiC epitaxy layer 1e) having a substantially uniform thickness.

The N− type drift region 3 (drift region) has, in the surface thereof, an N+ type source region 6 (source region) more heavily doped than that of the N− type drift region 3. This N− type drift region 3 has therein a P type floating region 5 (floating region or floating gate region) so as to be below and close to the N+ type source region 6.

From the surface to the inside of the N− type drift region 3, a P type gate region 4 is provided so as to sandwich therewith the floating region 5 and the source region 4 at least from both sides thereof. Further, the P type gate region 4 at an end portion of the active cell region 9 has, outside thereof, a P type junction termination region 8.

The semiconductor substrate 2 has, on the surface 1a thereof, for example, an interlayer insulating film 17 such as silicon oxide film. This interlayer insulating film 17 has thereon a metal source electrode 15 and is electrically coupled to the N+ type source region 6 via a source contact portion 11. On the other hand, the interlayer insulating film 17 has thereon a metal gate wiring 16 (metal gate electrode) and is electrically coupled to the P type gate region 4 (normal gate region) via a gate contact portion 12. The interlayer insulating film 17, the metal source electrode 15, the metal gate wiring 16, and the like are, except for a portion thereof, covered with a final passivation film 18.

(4) Stripe-Type (Modification Example 4) Gate-Island System Unit Cell Layout (Mainly, from FIG. 29 to FIG. 31)

This example employs a gate-island system corresponding to the stripe type source-island structure (from FIG. 19 to FIG. 21) and as is apparent from FIG. 29 to FIG. 31, it is characterized in that the unit cell region 10 runs longitudinally through the active cell region 9. Similar to the example of Sub-section (1), the structure in this example has the advantage of a simple cell structure.

In this example, on the other hand, the P type gate regions 4 (normal gate regions) are arranged in a substantially stripe form in the active cell region 9, but they are not linked with each other at the end portion of the active cell region 9. On the contrary, the P type floating regions 5 (floating gate regions) are arranged in a substantially stripe form in the active cell region 9 and they are linked with each other at the end portion of the active cell region 9.

This example has also a characteristic of the gate-island system and in a single metal structure, the gate regions 4 are each led outside the active cell region 9 through the comb-like metal gate wiring 16.

(5) Deformed Oblique Lattice Form (Modification Example 5) Gate-Island System Unit Cell Layout (Mainly from FIG. 32 to FIG. 34)

This example employs a gate-island system corresponding to the oblique lattice type source-island structure (from FIG. 22 to FIG. 24) and as is apparent from FIG. 32 to FIG. 34, it is characterized in that unit cell regions 10 in the columns adjacent to each other are displaced obliquely to form an oblique lattice. The P type floating regions 5 (floating gate regions) are, on the other hand, arranged in a stripe form in a planar view. This structure has the advantage similar to that of the example of Sub-section (1).

This example has also a characteristic of the gate-island system and in a single metal structure, the gate regions 4 are each led outside the active cell region 9 through the comb-like metal gate wiring 16.

6. Complementary Description of the Above-Mentioned Embodiment (Including Modification Examples) and General Consideration on the Embodiment (Mainly, FIG. 35)

Figure 35:
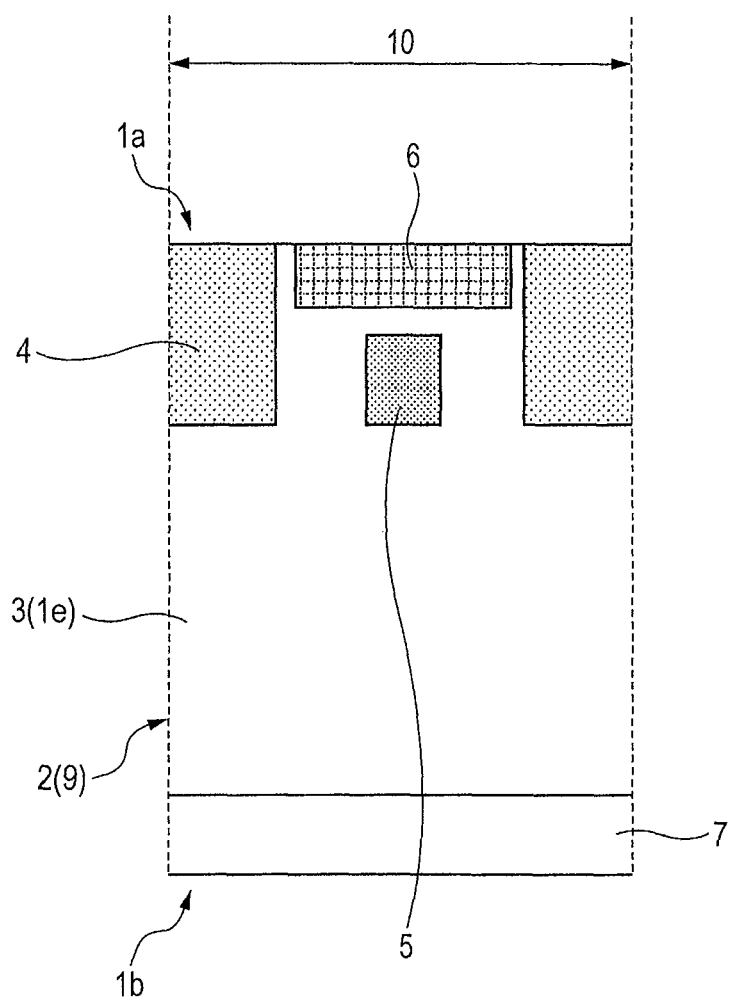
FIG. 35 is a fragmentary schematic cross-sectional view of a portion corresponding to the unit cell of FIG. 2 for describing the outline of the vertical-channel type junction SiC power FET according to the one embodiment of the present application.
Figure 36:
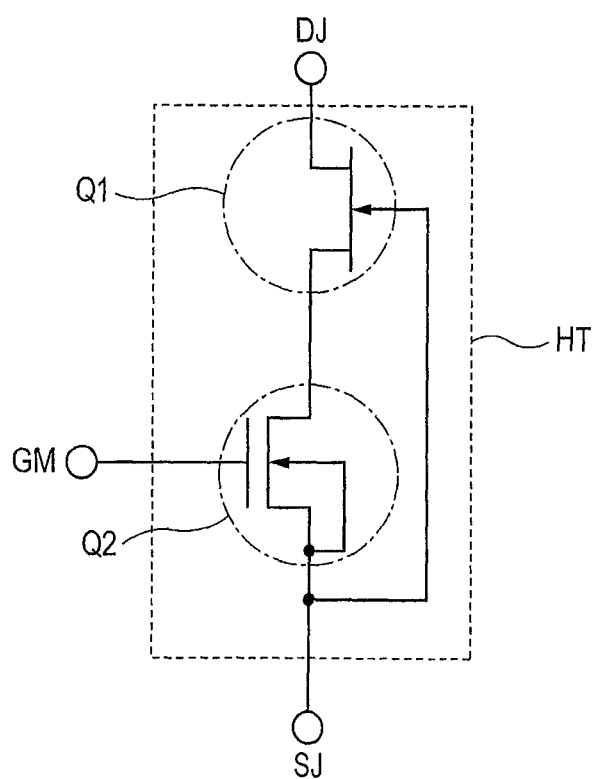
FIG. 36 is a circuit diagram of a normally off composite type transistor showing one example of a using state of the vertical-channel type junction SiC power FET according to the one embodiment of the present application.

FIG. 35 is a fragmentary schematic cross-sectional view of a portion corresponding to the unit cell of FIG. 2 for describing the outline of the vertical-channel type junction SiC power FET according to the one embodiment of the present application. FIG. 36 is a circuit diagram of a normally off composite type transistor showing one example of a using state of the vertical-channel type junction SiC power FET according to the one embodiment of the present application. Based on these drawings, the complementary description of the embodiment (including modification examples) and general consideration thereon will be carried out.

(1) Complementary Description of a Technical Problem and the Like:

As described above, in a SiC-based JFET (junction FET) showing a markedly low impurity diffusion rate compared with a silicon JFET or the like, a gate region is typically formed by forming a trench in a gate formation region and then carrying out ion implantation into the side wall of the trench or the like. In order to secure the performance of JFET, it is necessary to secure a gate depth while controlling a distance between gate regions with high precision. In other words, a channel region defined by the gate distance and the gate depth should be set at a high aspect ratio. Since a gate region is formed in a source region because of the limitation of the process, a highly doped PN junction is formed between the source region and the gate region, which inevitably causes various problems such as increase in junction current. In addition, ion implantation at markedly high energies (about 2 MeV) is necessary for manufacturing a termination structure (P type junction termination region).

As a method of forming a gate region without a troublesome trench formation process, ion implantation at high energies can be given as a candidate. In this case, the distance between gate regions can be controlled only by photolithography providing high precision and in addition, the source region and the gate region can be separated properly by mask layout. This method is however not a complete technical solution because implantation at high energies is inevitable.

(2) Description on the Outline of the Vertical-Channel Type Junction SiC Power FET According to the One Embodiment of the Present Application (Mainly, FIG. 35)

With a view to overcoming the above-described problem, according to the embodiment of the present application, as shown in FIG. 35, in the vertical-channel type junction SiC vertical FET, the floating gate region 5 as well as the normal gate region 4 having a gate potential is provided below and contiguous to the source region 6 provided in the surface region of the first main surface.

Such a structure enables formation of a high-aspect-ratio channel region.

When the potential of the main gate region 4 is equal to the potential of the source region 6, this structure (supposing that it has a normally on mode) is ON-state. Application of a minus voltage to the main gate region 4 extends a depletion layer to the side of the drift region 3 and limits the flow of an electric current. At this time, the auxiliary gate region 5 acts as a current limiting region. In other words, the auxiliary gate region 5 serves to decrease the thickness of the channel and thereby assists current control by the main gate region 4.

(3) Complementary Description of One Example of the Using State of the Vertical-Channel Type Junction SiC Power FET According to the Embodiment of the Present Application (Mainly, FIG. 36)

As the vertical-channel type junction SiC power FET (power JFET) according to the one embodiment of the present application, that operating in a normally on mode is shown specifically, because compared with a device operating in a normally off mode, the normally on mode device has advantages such as manufacturing ease and superior switching characteristics. Even if a normally on mode JFET is employed, it can be used as a cascode composite transistor HT as follows. As shown in FIG. 36, a high breakdown voltage normally on mode JFET (Q1) as a main device and, for example, a low breakdown voltage silicon-based or SiC-based normally off MOSFET (Q2) as an auxiliary device are cascade connected to each other. This device can be regarded totally as a normally off mode device having a drain terminal DJ of the normally on mode JFET (Q1), a source terminal SJ of the normally off MOSFET (Q2), and a gate terminal GM of the normally off MOSFET (Q2).

The auxiliary device Q2 may be either a silicon-based or a SiC-based one insofar as it is a normally off mode device. It may also be a MOS type or a junction type device. Using a SiC-based one as the auxiliary device Q2 has the advantage that it permits operation at high temperatures of 200° C. or greater. Using a silicon-based MOS device as the auxiliary device Q2, on the other hand, has the advantage that it enables cost reduction and provides good switching characteristics.

7. Summary

The invention made by the present inventors has been described specifically based on the embodiment. The present invention is however not limited to it but needless to say, it can be changed in various ways without departing from the scope of the invention.

For example, in the above embodiment, mainly an N channel type power JFET is specifically described. The invention is however not limited to it and needless to say, it can also be applied to a P channel type power JFET. In the above embodiment, mainly a normally on type power JFET is specifically described. The invention is however not limited to it and needless to say, it can also be applied to a normally off type power JFET.

In the above embodiment, an active device (such as FET, IGBT, or diode) using mainly a silicon carbide (SiC)-based semiconductor substrate (not only a 4H polytype but also a 6H polytype or the like) is described specifically. The invention is not limited to it and needless to say, it can also be applied to a GaN-based active device or the like.

In the above embodiment, a junction termination structure is described specifically with a junction termination extension as an example. The junction termination structure is however not limited to it and needless to say, it may be, for example, a field limiting ring, a field plate, a composite structure of them, or the like structure.

What is claimed is:

1. A semiconductor device including a junction FET, comprising:
    a drain region of a first conductivity type formed in an SiC semiconductor substrate;
    a drift region of the first conductivity type formed in the SiC semiconductor substrate, located over the drain region and having lower impurity concentration than the drain region;
    first and second gate regions of a second conductivity type opposite to the first conductivity type formed in the drift region; and
    a source region of the first conductivity type formed in the drift region, and formed between the first and second gate regions and having higher impurity concentration than the drift region,
    wherein a floating region of the second conductivity type is formed in the drift region, and is formed between the first and second gate regions and under the source region,
    wherein the floating region has a first portion and a second portion,
    wherein the first portion is formed between the first and second gate regions,
    wherein the second portion is located deeper than lower ends of the first and second gate regions, and
    wherein the first portion is within a width of source region in a planar view.

2. A semiconductor device according to the claim 1,
    wherein an interlayer insulating film is formed over the junction FET,
    wherein a gate wiring is formed over the interlayer insulating film and electrically connected to the first and second gate regions,
    wherein a source wiring is formed over the interlayer insulating film and electrically connected to the source region, and
    wherein the floating region is not electrically connected to the gate wiring and the source wiring.

3. A semiconductor device according to the claim 1,
    wherein a width of the lower end of the floating region is wider than a width of an upper portion of the floating region.

4. A semiconductor device according to the claim 1, wherein the first conductivity type is an n-type, and wherein the second conductivity type is a p-type.

5. A semiconductor device according to the claim 1,
    wherein an operation mode of the junction FET is a normally on type.

6. A semiconductor device according to the claim 1,
    wherein the first and second gate regions are arranged in a mesh form in a planar view.

7. A semiconductor device according to the claim 1,
    wherein the first portion is narrower than the second portion.

8. A semiconductor device according to the claim 1,
    wherein the lower end of the first portion is located higher than lower ends of the first and second gate regions.

* * * * *